(12) United States Patent
Takayama et al.

(10) Patent No.: US 7,323,368 B2
(45) Date of Patent: Jan. 29, 2008

(54) METHOD FOR MANUFACTURING SEMICONDUCTOR DEVICE AND HEAT TREATMENT METHOD

(75) Inventors: Toru Takayama, Atsugi (JP); Shunpei Yamazaki, Setagaya (JP); Tetsuji Yamaguchi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/664,866

(22) Filed: Sep. 22, 2003

(65) Prior Publication Data

US 2004/0132293 A1 Jul. 8, 2004

(30) Foreign Application Priority Data

Sep. 20, 2002 (JP) ............................. 2002-276402

(51) Int. Cl.
*H01L 21/00* (2006.01)
(52) U.S. Cl. ........................................ 438/149; 257/436
(58) Field of Classification Search ................ 438/197
See application file for complete search history.

(56) References Cited

U.S. PATENT DOCUMENTS

| | | | |
|---|---|---|---|
| 4,951,601 A | 8/1990 | Maydan et al. | |
| 5,043,299 A | 8/1991 | Chang et al. | |
| 5,286,296 A | 2/1994 | Sato et al. | |
| 5,306,651 A | 4/1994 | Masumo et al. | |
| 5,310,410 A | 5/1994 | Begin et al. | |
| 5,324,360 A | 6/1994 | Kozuka | |
| 5,587,520 A | 12/1996 | Rhodes | |
| 5,771,110 A | 6/1998 | Hirano et al. | |
| 6,051,453 A * | 4/2000 | Takemura | 438/166 |
| 6,177,302 B1 | 1/2001 | Yamazaki et al. | |
| 6,261,877 B1 | 7/2001 | Yamazaki et al. | |
| 6,323,142 B1 | 11/2001 | Yamazaki et al. | |
| 6,323,528 B1 | 11/2001 | Yamazaki et al. | |
| 6,329,229 B1 | 12/2001 | Yamazaki et al. | |

(Continued)

FOREIGN PATENT DOCUMENTS

JP 05-044017 2/1993

(Continued)

*Primary Examiner*—Thao P. Le
(74) *Attorney, Agent, or Firm*—Eric J. Robinson; Robinson Intellectual Property Law Office, P.C.

(57) ABSTRACT

It is an object of the present invention to apply a technique for removing the adverse effect of a substrate shrinkage due to a heat treatment, and further forming a fine and high-quality insulating film, and a semiconductor device that can realize high-performance and high-reliability by using the same, to a transistor formed by laminating a semiconductor film or an insulating film over a glass substrate.

A heat treatment that is necessary in a step of forming a thin film element by laminating a semiconductor film or an insulating film over a glass substrate is performed without thermally-damaging the substrate. For the purpose, a light-absorbing layer that can absorb pulsed light over a particular portion of the substrate in which the thin film element is formed is locally formed, and the heat treatment is performed. A semiconductor layer or an insulating layer is disposed between the light-absorbing layer and the substrate, and thus, the portion overlapping with the light-absorbing layer is selectively heated to high temperature and the heat treatment can be performed.

31 Claims, 13 Drawing Sheets

U.S. PATENT DOCUMENTS

| | | | |
|---|---|---|---|
| 6,492,659 B1 | 12/2002 | Yamazaki et al. | |
| 6,492,681 B2 | 12/2002 | Koyama et al. | |
| 6,498,369 B1 | 12/2002 | Yamazaki et al. | |
| 6,500,704 B1 | 12/2002 | Hirano et al. | |
| 6,555,843 B1 | 4/2003 | Yamazaki et al. | |
| 6,576,534 B1* | 6/2003 | Zhang et al. | 438/486 |
| 6,599,790 B1* | 7/2003 | Yamazaki et al. | 438/166 |
| 6,599,818 B2* | 7/2003 | Dairiki | 438/486 |
| 6,602,765 B2* | 8/2003 | Jiroku et al. | 438/487 |
| 6,614,076 B2 | 9/2003 | Kawasaki et al. | |
| 6,620,658 B2 | 9/2003 | Isobe et al. | |
| 6,632,749 B2* | 10/2003 | Miyasaki et al. | 438/788 |
| 6,790,714 B2 | 9/2004 | Hirano et al. | |
| 6,822,261 B2 | 11/2004 | Yamazaki et al. | |
| 6,838,397 B2 | 1/2005 | Takayama et al. | |
| 7,183,229 B2 | 2/2007 | Yamanaka | |
| 2001/0009283 A1 | 7/2001 | Arao et al. | |
| 2001/0015441 A1 | 8/2001 | Kawasaki et al. | |
| 2001/0049163 A1 | 12/2001 | Yamazaki et al. | |
| 2002/0000551 A1 | 1/2002 | Yamazaki et al. | |
| 2002/0001886 A1 | 1/2002 | Ohtani | |
| 2002/0043660 A1 | 4/2002 | Yamazaki et al. | |
| 2002/0056839 A1* | 5/2002 | Joo et al. | 257/63 |
| 2002/0061661 A1 | 5/2002 | Dairiki | |
| 2002/0101395 A1 | 8/2002 | Inukai | |
| 2002/0110940 A1 | 8/2002 | Yamagata et al. | |
| 2002/0113248 A1 | 8/2002 | Yamagata et al. | |
| 2002/0121860 A1 | 9/2002 | Seo et al. | |
| 2002/0160554 A1 | 10/2002 | Isobe et al. | |
| 2003/0013280 A1 | 1/2003 | Yamanaka | |
| 2004/0021177 A1 | 2/2004 | Akimoto et al. | |
| 2004/0077134 A1 | 4/2004 | Takayama et al. | |
| 2007/0087492 A1 | 4/2007 | Yamanaka | |

FOREIGN PATENT DOCUMENTS

| | | |
|---|---|---|
| JP | 07-321335 | 12/1995 |
| JP | 08-051076 | 2/1996 |
| JP | 09-260286 | 10/1997 |
| JP | 10-026772 | 1/1998 |
| JP | 10-084085 | 3/1998 |
| JP | 2001-102585 | 4/2001 |
| JP | 2002-246328 | 8/2002 |
| JP | 2002-252174 | 9/2002 |

* cited by examiner

METHOD FOR MANUFACTURING SEMICONDUCTOR DEVICE AND HEAT TREATMENT METHOD

TECHNICAL FIELD

The present invention relates to a method for manufacturing a semiconductor device including a semiconductor element in which a semiconductor layer and an insulating film are laminated over a substrate having an insulating surface, and specifically, an advantageous technique for a method for manufacturing a semiconductor device using a glass or the like that is heat-sensitive as a substrate.

Further, the present invention relates to a heat treatment method that is performed by pulsed light irradiation, and an advantageous technique for a heat treatment to a heat-sensitive substrate such as a glass.

BACKGROUND ART

A technique for manufacturing a thin film transistor (TFT) by using polycrystalline silicon using a glass as a substrate that has been crystallized by laser annealing has been developed. A barium borosilicate glass, an aluminosilicate glass, or the like whose distortion point is equal to or less than 700° C. is used as the material of the glass substrate for this use. Accordingly, the maximum temperature acceptable in TFT manufacturing process is equal to or less than the distortion point such that a glass substrate may not be deformed. The importance of laser annealing or rapid thermal annealing (RTA) technique increases as silicon crystallization or an activation treatment of donor or acceptor impurities added into silicon. RTA is a heat treatment technique for heating instantly within several microseconds to several tens seconds and for annealing with electromagnetic wave radiated from a halogen lamp or the like, within the range of from the visible-light region to the infrared light region.

As for silicon film crystallization, there is a case where an amorphous silicon film is directly irradiated with laser light for crystallization. Further, as another mode, there is a technique for improving properties of a gate insulating film as well as enhancing silicon crystallinity by forming the gate insulating film on an island-like crystalline silicon film and then performing laser annealing (For example, Patent Literature 1).

Further, there is a method for accumulating heat in a metal layer formed between a glass substrate and a polycrystalline silicon film for the sake of effectively utilizing heat of RTA, as a technique for activating n-type impurity added into the polycrystalline silicon film over the glass substrate (For example, Patent Literature 2).

On the contrary, in response to miniaturization of a semiconductor element, a flash lamp anneal apparatus is developed, which has a flash lamp using gas plasma as a heat source, and the flash lamp anneal apparatus can raise temperature more rapidly than RTA apparatus using a tungsten halogen lamp as a heat source. The flash lamp anneal apparatus has been improved, particularly, in such a way that it can be applied to formation of a shallow diffusion region that is necessary for a MOS transistor whose gate length is equal to or less than 0.1 μm (For example, Patent Literature 3).

[Patent Literature 1]

Japanese Patent Laid-Open No. Hei 7-321335. (pp. 4–5. See FIG. 1)

[Patent Literature 2]

Japanese Patent Laid-Open No. 2001-102585. (pp. 5–6. See FIG. 1)

[Patent Literature 3]

Japanese Patent Laid-Open No. 2002-246328. (pp. 4–6. See FIG. 1)

DISCLOSURE OF THE INVENTION

[Problems to be Solved by the Invention]

A thermally-oxidized film that is formed by oxidizing a surface of silicon at temperature of 900° C. or more is effectively used in the manufacturing technique of a MOS transistor to be incorporated in a single crystal silicon substrate. On the other hand, when the above-described glass substrate is exposed to a heat treatment at the temperature of 500° C. or more, the substrate is shrunk at least at the rate of several tens ppm or more. Therefore, a mask pattern to be used in a light-exposure step cannot be overlapped before/after the heat treatment. That is, a relative position of overlapping of a semiconductor layer and a gate electrode or a contact hole is misaligned. Thus, it is impossible to complete a TFT with a predetermined size. The adverse influence becomes more apparent, as the design rule of a mask reaches sub-micron level.

Accordingly, even as for a gate insulating film that is main part of a TFT, there is employed a technique for depositing a film by using chemical or physical phenomena like a plasma CVD or sputtering.

However, it is substantially impossible to reduce fluctuation on a threshold voltage or gate leak, because of fixed electric charges or interface state density, so-called, in a silicon oxide film or a silicon nitride film to be deposited at the temperature of 400° C. or less, different from a clean thermally oxidized film that is obtained by oxidizing silicon at the temperature of 900° C. or more. As for miniaturization of an integrated circuit, even if the size of a TFT in plan is only made small while keeping the thickness of a gate insulating film, the property fluctuation becomes large, and driving performance of TFTs is not enhanced. As a result, high performance of an apparatus using it cannot be realized. Accordingly, it is necessary to make a gate insulating film thinner based on scaling law.

Improvement in film-quality by a heat treatment can be obtained more effectively with higher temperature as long as it is thermal activation type reaction. Laser annealing can instantly heat a portion absorbing the laser light to high temperature by performing a very short time of light irradiation with high energy density. On the contrary, the laser annealing cannot effectively provide a portion that does not absorb the laser light, with thermal action. In other words, it is possible to crystallize a silicon film over a glass substrate without thermally-damaging the glass substrate at the time.

However, as described in the above patent literature 2, when the method of accumulating heat in a metal film formed between a glass substrate and a polycrystalline silicon film is employed, there is a limitation on a shape of an element, and thus, an effective heat treatment cannot be performed on the portion that is actually required to be heated. For example, it is impossible to effectively perform improvement in quality of a gate insulating film formed on a semiconductor layer, through a heat treatment.

Similarly, as described in the above patent literature 1, when the method of laser annealing after forming a gate insulating film on a crystalline silicon film is employed, there is a limitation on oscillator type, since an ultraviolet laser such as KrF excimer laser (wavelength: 248 nm) having a short wavelength is required. Further, in the mode in which films having different absorption coefficient to laser light to be emitted are laminated, it is difficult to set an appropriate laser annealing condition while striking the balance between the two films.

The present invention has been made in view of the above-described problems. It is an object of the present invention to apply a technique for removing the adverse effect of a substrate shrinkage due to a heat treatment, and forming a fine and high-quality insulating film, to a transistor formed by laminating a semiconductor film or an insulating film over a substrate such as glass that is heat-sensitive, and a semiconductor device that can realize high-performance and high-reliability by using the technique. Further, it is another object of the present invention to provide a semiconductor device including a large-area integrated circuit using a transistor formed from an excellent insulating layer as a constituent element.

[Means for Solving the Problem]

The summary of the present invention is as follows. A heat treatment that is necessary in a step of forming a thin film device to be formed by laminating a semiconductor film or an insulating film over a substrate such as glass that is heat-sensitive is performed without thermally-damaging the substrate. For the purpose, a light-absorbing layer that can absorb pulsed light is locally formed over a particular portion of the substrate in which the thin film device is formed, and the heat treatment is performed. A semiconductor layer or an insulating layer is disposed between the light-absorbing layer and the substrate, and thus, the portion overlapped with the light-absorbing layer is selectively heated to high temperature and the heat treatment can be performed. A material that has poor absorption of pulsed laser and that is difficult to be heated is applied to the substrate to be used in the present invention, and a film to absorb pulsed laser light is provided locally for a main surface of the substrate and a heat treatment is performed by heating a structure as a target with conductive heating from the film.

In other words, the light-absorbing layer raises temperature by absorbing pulsed light that is coherent or non-coherent, and a semiconductor layer or an insulating layer is heated by conductive heating of the heat. The light-absorbing layer is formed locally over the substrate, so that a whole substrate is not heated to high temperature, thereby reducing thermal damages (changes such as warping and shrinking due to thermal history) on the substrate.

According to the present invention, the light-absorbing layer is irradiated with pulsed light in a wavelength band of from the ultraviolet region to the infrared region and heated, and a heat treatment for a silicon oxide film or a silicon nitride film, and a laminate thereof that have poor absorption of the pulsed laser light is effectively performed by thermal conductive heating. Further, an impurity region formed in a semiconductor layer is activated in a structure in which the insulating film or the laminate thereof and the semiconductor layer are overlapped.

A method for manufacturing a semiconductor device based on the above-described summary of the present invention can include a structure described below.

A method for manufacturing a semiconductor device, including a heat treatment step of pulsed light irradiation, comprising the steps of: forming separately island-like light-absorbing layers that are capable of absorbing the pulsed light over a glass substrate; forming a semiconductor layer and an insulating layer overlapping with the semiconductor layer between the glass substrate and the light-absorbing layers; and performing the heat treatment for the semiconductor layer and the insulating layer by selectively heating a region where the light-absorbing layer is formed, through the pulsed light irradiation.

In a structure of the present invention, the portion where the light-absorbing layer is formed can selectively be heated by separately forming the island-like light-absorbing layers whose transmission factor of pulsed light is 70 percent or less over a glass substrate whose transmission factor of the pulsed light that is emitted for heating is 70 percent or more.

A method for manufacturing a semiconductor device comprising the steps of: forming island-like light-absorbing layers formed over a glass substrate having an insulating surface such that a length of one side of each of the island-like light-absorbing layers is equal to or less than a thickness of the glass substrate; forming a semiconductor layer and an insulating layer overlapping with the semiconductor layer between the glass substrate and the light-absorbing layers; and performing a heat treatment for the semiconductor layer and the insulating layer by selectively heating a region where the light-absorbing layer is formed through pulsed light irradiation.

In a structure of the present invention, the portion where the light-absorbing layer is formed can selectively be heated by separately forming the island-like light-absorbing layers whose transmission factor of pulsed light is 70 percent or less over a glass substrate whose transmission factor of the pulsed light that is emitted for heating is 70 percent or more.

A method for manufacturing a semiconductor device comprising the steps of: forming island-like divided semiconductor layers over a glass substrate having an insulating surface; forming a light-absorbing layer that overlaps with a whole surface of each of the semiconductor layer and end portions thereof are arranged outside of each of the semiconductor layers, over an insulating layer that exists over each of the semiconductor layers; and performing a heat treatment for each of the semiconductor layers and the insulating layer by selectively heating a region where the light-absorbing layer is formed, through pulsed light irradiation.

An insulating film may be disposed between the glass substrate and the semiconductor layers in order to prevent contamination due to impurity diffusion from the substrate side during heat treatment. Also, a step of forming a gate electrode overlapping with the semiconductor layers by etching after forming a metal layer over the light-absorbing layer may be employed.

A plurality of pulsed light irradiation may be performed in order to substantially prolong the time of the heat treatment without raising the temperature of the glass substrate.

In a structure of the present invention, the portion where the light-absorbing layer is formed can selectively be heated by separately forming island-like light-absorbing layers whose transmission factor of pulsed light is 70 percent or less over a glass substrate whose transmission factor of the pulsed light that is emitted for heating is 70 percent or more.

In the structure of the present invention, the light-absorbing layer is formed from a high melting point metal such as molybdenum (Mo), tungsten (W), titanium (Ti) or chrome (Cr), a metal nitride such as titanium nitride (TiN), tantalum nitride (TaN), or tungsten nitride (WN), or tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). By using the materials, a film having a thickness of from 10 to 50 nm, preferably from 20 to 40 nm has transmission factor of the pulsed light in a wavelength band of from the ultraviolet region to the infrared region, of 70 percent or less. By using the film together with a glass substrate that has transmission factor of 70 percent or more of non-coherent electro magnetic wave in the same wavelength region, the region in which the film having the good absorption is formed can selectively be heated.

In the structure of the present invention, the pulsed light is coherent light or non-coherent light. Typically, the coherent light having a pulse width of from 10 to 100 nanoseconds, or the non-coherent light having a pulse width of from 1 to 100 microseconds. Namely, a light source of the pulsed light can be selected as necessary from a light source such as a gas laser or a solid-state laser supplying coherent light, or a light source such as a xenon flash lamp supplying non-coherent light.

The heat treatment method of the present invention based on the described-above summary of the present invention can include a structure described below.

A heat treatment method comprising the steps of: forming and patterning a light-absorbing layer over a glass substrate having an insulating surface such that a length of one side of the light-absorbing layer is equal to or less than a thickness of the glass substrate; providing an object to be heated that is arranged inside of the light-absorbing layer, between the glass substrate and the light-absorbing layer; and performing a heat treatment for the object to be heated by selectively heating a region where the light-absorbing layer is formed, through pulsed light irradiation.

In the structure of the present invention, the portion where the light-absorbing layer is formed can selectively heated by separately forming island-like light-absorbing layers whose transmission factor of pulsed light is 70 percent or less over a glass substrate whose transmission factor of the pulsed light that is emitted for heating is 70 percent or more.

In the structure of the present invention, the light-absorbing layer is formed from a high melting point metal such as molybdenum (Mo), tungsten (W), titanium (Ti) or chrome (Cr), a metal nitride such as titanium nitride (TiN), tantalum nitride (TaN), or tungsten nitride (WN), or tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). By using the materials, a film having a thickness of from 10 to 50 nm, preferably from 20 to 40 nm has transmission factor of the pulsed light in a wavelength band of from the ultraviolet region to the infrared region, of 70 percent or less. By using the film together with a glass substrate that has transmission factor of 70 percent or more of non-coherent electro magnetic wave in the same wavelength region, the region in which the film having good absorption is formed can selectively be heated. In other words, only the region that is required to be heated on the glass substrate can selectively be heated. According to this structure, the heat treatment temperature can be equal to or more than distortion temperature of the glass substrate (in a region having good absorption), thereby enhancing the effect of the heat treatment.

In the structure of the present invention, the pulsed light is coherent light or non-coherent light. Typically, the coherent light having a pulse width of from 10 to 100 nanoseconds, or the non-coherent light having a pulse width of from 1 to 100 microseconds. Namely, a light source of the pulsed light can be selected as necessary from a light source such as a gas laser or a solid-state laser supplying coherent light, or a light source such as a xenon flash lamp supplying non-coherent light.

[Effect of the Invention]

According to the present invention, between a substrate and a light-absorbing layer, a semiconductor layer arranged inside of the light-absorbing layer and an insulating layer overlapping with the semiconductor layer are formed, and the semiconductor layer forms an active layer of a TFT by performing a heat treatment with coherent or non-coherent pulsed light in a wavelength band of from the visible light region to the infrared region to disperse stress. Particularly, it is possible to prevent stress from remaining in a portion in which a gate is formed. Namely, it is possible to form an insulating film that is favorably applicable and fine, and has high-quality, to a transistor formed over a substrate such as a glass that is heat-sensitive. The width of a gate wiring connected to a top hat shaped two-layered gate electrode can freely be set (no eaves of the lower light-absorbing layer exists) and the wirings can be arranged at the high density according to the present invention.

BEST MODES TO CARRY OUT THE INVENTION

Hereinafter, embodiment modes of the present invention are described with reference to the drawings. However, the present invention can be implemented with many different embodiment modes, and it is to be understood that various changes of the modes and details will be apparent to those skilled in the art, unless such changes and modifications depart from the scope of the present invention. Accordingly, the present invention is not limited to the content that is described in the present embodiment modes.

According to the present invention, a thin film device which is formed by appropriately laminating a semiconductor thin film, an insulating thin film or a conductive thin film over a substrate, can effectively express the effect of the heat treatment to be required in the manufacturing step thereof. In particular, according to the present invention, a particular portion for manufacturing the thin film device over a substrate is selectively heated so that a heat treatment to be required in the step of manufacturing the thin film device typified by a TFT by using a heat-sensitive substrate, such as a glass, whose distortion temperature is 700° C. or less, is performed without thermally damaging the substrate. For the purpose, a film that can raise the temperature of the portion is locally formed to perform a heat treatment by coherent or non-coherent pulsed light irradiation in a wavelength band of from the ultraviolet region to the infrared region. A light source supplying coherent or non-coherent pulsed light in a wavelength band of from the ultraviolet region to the infrared region is a laser oscillator or a lamp light source such as a xenon flash lamp. The laser oscillator is a gas laser oscillator or a solid-state laser oscillator that oscillates with a pulse width of from 10 to 100 nanoseconds, and is one of flash lamp excitation or diode excitation that uses crystal such as YAG, $YVO_4$, YLF, $YAlO_3$ or the like doped with Cr, Nd, Er, Ho, Ce, Co, Ti, or Tm.

It is possible to perform a local heating treatment for heating a particular region of a semiconductor film or an insulating film formed over the substrate by combining a heat treatment using a light source that emits this coherent or non-coherent pulsed light irradiation in a wavelength band of from the ultraviolet region to the infrared region, with a light-absorbing layer whose transmission factor of the pulsed light is 70 percent or less and that absorbs it, over a substrate whose transmission factor of the pulsed light in the wavelength band is 70 percent or more.

A substrate used in the present invention is a substance that is transparent to light in the visible light region and includes a commercially-manufactured glass substrate, which is called as no alkali glass substrate such as barium borosilicate glass or alumino silicate glass. Alternatively, quartz, sapphire, or the like may be used for the substrate. These substrates have a characteristic that the transmission factor of non-coherent light in a wavelength band of from the visible light region to the infrared region is 70 percent or more, preferably 80 percent or more.

The light-absorbing layer is a high melting point metal such as molybdenum (Mo), tungsten (W), or titanium (Ti), a metal nitride such as titanium nitride (TiN), tantalum nitride (TaN), or tungsten nitride (WN), or silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$). Alternatively, polycrystalline silicon doped with phosphorous or boron may be used.

FIG. 3 is a graph showing transmission factors and reflectance of tungsten (W) (50 nm in thickness), titanium (Ti) (50 nm in thickness), titanium nitride (TiN) (50 nm in thickness), and tantalum nitride (TaN) (30 nm in thickness) that are used for the light-absorbing layer. The metals or nitride metals have transmission factor of 70 percent or less in a wavelength band of from 300 to 800 nm, and also reflectance of 20 percent or less. On the contrary, FIG. 4 shows the transmission factor and reflectance of a 0.7-mm-thick glass substrate using aluminosilicate as the material, and the substrate has the transmission factor of 70 percent or more in the wavelength band of from 350 to 800 nm, and the transmission factor of 90 percent or more in the wavelength band of from 400 to 800 nm. As apparent form the comparison of FIG. 3 and FIG. 4, it is possible that the light-absorbing layer selectively absorbs light and local heating is performed by partially forming a light-absorbing layer over a substrate transparent to the spectrum. The light-absorbing layer has a characteristic that becomes an absorber to pulsed light to be emitted in the wavelength.

FIG. 1 shows details about a heat treatment that is performed by local heating method according to the present invention. FIG. 1(A) shows a cross sectional structure of a mode where a heat treatment is performed on a substrate 101 by pulsed light 107 irradiation, where a first insulating layer 102, an island-like semiconductor layer 103, second insulating layers 104 and 105, and a light-absorbing layer 106 are formed. The light source of the pulsed light 107 is disposed, facing the surface of the substrate 101 where the semiconductor layer 103, the light absorbing layer 106, and the like are formed and the almost whole surface is irradiated with the pulsed light 107. It should be noted that the pulsed light may be emitted from the substrate 101 side (the side where the light-absorbing layer 106 is not formed) or from the both sides.

The light-absorbing layer 106 is formed in such a way that the light-absorbing layer 106 covers the semiconductor layer 103 and the end portions thereof are arranged outside of end portions of the semiconductor layer 103. A region where the light-absorbing layer 106 is formed and a region where the light-absorbing layer 106 is not formed have different increase in temperature and heat stress concentrates in a boundary 108 therebetween. The semiconductor layer 103 is not arranged in the portion, thereby preventing distortion due to the heat stress. FIG. 1(B) is a top view in which lengths x and y of protruding portions of the light-absorbing layer 106 that is formed over the semiconductor layer 103, is from 1 to 5 μm, preferably from 2 to 3 μm.

The light-absorbing layer 106 that is formed in island-like like the semiconductor layer 103 is locally provided to be heated selectively. Particularly, pulsed light using a laser oscillator as a light source can be condensed by a lens or the like and emitted on a limited region of the substrate 101. Thus, it is possible to prevent heat from diffusing to the periphery by forming the island-like semiconductor layer 106 separately. Further, in the case where the whole surface of the substrate 101 is irradiated with pulsed light by a xenon flash lamp or the like, distortion of the whole substrate 101 due to the heat stress is prevented. For the sake of enhancing the effect effectively, the length of a side of one island-like light-absorbing layer 106 is almost equal to or less than the film thickness of the substrate 101. Preferably, one side is equal to or less than one fifth of the thickness of the substrate. If one side of the light-absorbing layer 106 is longer than that, distortion power of the substrate is superior and thus, the substrate is deformed.

The whole light-absorbing layer 106 may be removed after heat treatment, or exposed to etching process after heat treatment to form a portion of wiring or electrode material. A portion of the light-absorbing layer 106 is left to form a part of a gate electrode in FIGS. 2(A) and 2(B). The original light-absorbing layer 106 is exposed to etching process, and thus, the end portions recede to form a predetermined shape. A processed light-absorbing layer 109 may be a gate electrode by itself, or a second light-absorbing layer 110 is formed thereon and a top hat shaped gate electrode may be formed as a whole.

The top hat shaped gate electrode comprising the light-absorbing layers 109 and 110 can form a TFT having a gate overlap LDD (Lightly Doped Drain) structure by using the unique shape. This can be realized as described next. The thickness of the light-absorbing layer 109 and the thickness of the second light-absorbing layer 110 are made different and the latter is larger than the former, thereby producing the ion blocking ability and forming an impurity region 111 overlapping with the light-absorbing layer 109. FIG. 2(B) is a top view of this structure and the channel length (gate length) (Li) is determined by the length of the second light-absorbing layer 110 and the length of the gate overlap LDD (Lov) corresponds to the length of a protruding portion of the light-absorbing layer 109 in the gate electrode comprising the light-absorbing layer 109 and the second light-absorbing layer 110.

As a preferable mode of the present invention, the gate insulating film is a laminate of a silicon oxide film that is formed by sputtering applying high frequency power in the atmosphere containing oxygen or oxygen and noble gas using silicon as a target, and a silicon nitride film that is formed by sputtering applying high frequency power in the atmosphere containing nitrogen or nitrogen and noble gas using silicon as a target. The laminate is deposited at the substrate heating temperature of 400° C. or less, preferably 300° C. or less. And a defect density on a laminated layer interface or a defect density in a film and distortion are effectively reduced by the heat treatment after film formation. The heat treatment is performed, as shown in FIG. 1, by providing locally a light-absorbing layer over a particular portion of the substrate 101 and irradiating the portion with coherent pulsed light with pulse width of from 10 to 100 nanoseconds or non-coherent pulsed light with pulse width of from 1 to 100 microseconds once or a plurality of times.

In the case of forming silicon oxide and silicon nitride films by RF sputtering using silicon as a target, as main film forming conditions for the silicon oxide film, silicon is used as a target, and oxygen or oxygen and a noble gas are used as a sputtering gas. For the silicon nitride film, similarly, a silicon target is used, and nitrogen or nitrogen and a noble gas are used as a sputtering gas. Although a frequency of a high-frequency power to be applied is typically 13.56 MHz, a frequency of 27 to 120 MHz higher than that may be applied. As the frequency increases, a chemical reaction becomes more predominant for a mechanism for the film formation, and the formation of the film which is fine and with less damage to the base film can be expected. There is a case of introducing the noble gas used as the sputtering gas from the backside of the substrate as a gas for heating the substrate. As a heating temperature of the substrate, no heating may be performed specifically to perform film formation in a state of a room temperature. However, in order to further improve adhesion with the base, the substrate is heated at temperatures of from 100 to 300° C., preferably at temperatures of from 150 to 200° C. Thus, the favorable adhesion can be obtained.

The sputtering method applied in the present invention is a sputtering method in which a mixing ratio of oxygen and a noble gas or nitrogen and a noble gas is selected in a range in which a maximum ratio thereof is 1:1. In particular, as radical species of oxygen or nitrogen are actively used for the reaction, the sputtering method is different from a film forming mechanism according to a conventional physical sputtering phenomenon using ion collusions. That is, it can be considered that a chemical film forming mechanism is predominant in that the sputtering method is characterized by causing radicals of oxygen or nitrogen and silicon to react with each other on a target surface and a surface of a deposited film.

In other words, when glow discharge plasma is formed by applying high-frequency power to a target, radicals which are chemically extremely active among radicals of oxygen or nitrogen react with silicon even with low energy to form oxides or nitrides. That is, active radicals of oxygen or nitrogen diffused over a target surface react with silicon to form oxides or nitrides. Although the oxides or the nitrides of silicon are stable, when a noble gas ion is accelerated in a sheath electric field and enters the target surface, the oxides or the nitrides are sputtered to be emitted into a gas phase. The oxides or the nitrides of silicon diffusing in the glow discharge plasma undergo a gas phase reaction even in the plasma, and a part of them reaches a substrate surface. The oxides or the nitrides of silicon undergo a surface reaction there, thus a film is formed. It is considered that assistance of ion species, which are accelerated by a potential difference between a plasma potential and a ground potential and enter the surface, also acts in the surface reaction.

If a mixing rate of the noble gas is set higher than that of oxygen or nitrogen to be supplied, sputtering by noble gas ions becomes predominant (i.e., physical sputtering becomes predominant), and such a film forming mechanism cannot be realized. It is ideal to use only oxygen gas or nitrogen gas. However, since the film forming speed extremely slows down, it is preferable to select a mixing ratio of oxygen and a noble gas or nitrogen and a noble gas in a range in which a maximum ratio thereof is 1:1.

Naturally, in terms of probability, there is a case where a very small cluster of silicon may be mixed into a film to be deposited, by being sputtered. The silicon cluster taken into the silicon oxide or the silicon nitride film becomes defects of capturing charges and causes hysteresis. The heat treatment, which is performed after forming this type of film by sputtering, becomes an effective means for eliminating these defects. That is, by supplying oxygen or nitrogen to oxidize or nitride the silicon cluster, generation of the charging defects can be eliminated. The oxidation reaction or the nitriding reaction is not limited to the oxygen or nitrogen supplied from the gas phase, but may use excessive oxygen or nitrogen contained in the film.

As described above, according to the present invention, by applying the heat treatment that is local heating type by pulsed light irradiation to the heat treatment for the gate insulating film comprising a silicon oxide film and a silicon nitride film, or the laminate thereof formed by RF sputtering using a silicon target, a silicon oxide film and a silicon nitride film can be obtained, which are fine and stable with respect to thermally and electrically exogenous stress, even on a glass substrate heat-sensitive of a substrate temperature of 300° C. or less. Such a silicon oxide film, a silicon nitride film and a laminate thereof are useful when they are used as a gate insulating film for, in particular, a thin film transistor (which is an insulated gate type field effect transistor) formed over a heat-sensitive glass substrate. Naturally, the silicon oxide film and the silicon nitride film or the laminate are not limited to a gate insulating film but can be applied to various applications such as a base insulating film formed between a semiconductor layer and a substrate, an interlayer insulating film that is insulating between wirings, and a protective film preventing intrusion of impurities from the outside.

Modes of the semiconductor device applying the heat treatment method according to the present invention is hereinafter described in detail with reference to the drawings.

EMBODIMENT 1

A mode of completing a TFT by performing local heating annealing of pulsed light irradiation according to the present invention on a laminate, which is obtained by laminating a silicon oxide film and a silicon nitride film manufactured by RF sputtering method using silicon as a target and exposed to a heat treatment, is described.

FIG. 5 shows a step for forming a crystalline silicon film over a glass substrate. As a substrate 201 which can be applied in the present invention, a glass substrate containing barium borosilicate glass, alumino borosilicate glass, aluminosilicate glass, or the like as the material is suitable. Representatively, a 1737 glass substrate (distortion point 667° C.) manufactured by Corning Incorporated, AN 100 (distortion point 670° C.) manufactured by Asahi Glass Co., Ltd., and the like are applicable. However, it goes without saying that other similar substrates may be applied without any specific limitation. In any case, it is possible to apply a glass substrate with a distortion point of 700° C. or less to the present invention. Naturally, a synthetic quartz substrate with a heat resistance temperature of 1000° C. or more may be applied.

First, as shown in FIG. 5(A), a first insulating layer 202 made of an insulating film such as a silicon oxide film, a silicon nitride film, or a silicon oxynitride film (SiOxNy) is formed over a glass substrate 201. A representative example is a structure for laminating a first silicon oxynitride film, which is formed by the plasma CVD with $SiH_4$, $NH_3$, and $N_2O$ as a reactive gas at the substrate heating temperature of 400° C. and has a nitride content almost equal to or larger than an oxygen content, and a second oxynitride silicon film, which is formed by the plasma CVD with $SiH_4$ and $N_2O$ as a reactive gas at the substrate heating temperature of 400° C. and has an oxygen content larger than a nitrogen content.

In this structure, the first silicon oxynitride film may be replaced with a silicon nitride film which is formed by RF sputtering. The silicon nitride film can prevent alkali metals such as sodium (Na) contained in the glass substrate in a very small amount from diffusing.

A semiconductor layer forming a channel portion and a source/drain portion of a TFT is obtained by crystallizing an amorphous silicon film 203 formed on the first insulating layer 202. An amorphous silicon film is formed by plasma CVD method at the substrate heating temperature of 300° C. to have a film thickness of from 20 to 60 nm. The upper limit of this film thickness is an upper limit value for operating the silicon film as a film of a perfect depletion type in a channel forming region of the TFT. The lower limit value of this film thickness is a limitation on process and is determined as a minimum value which is necessary in the case where the crystalline silicon film is selectively processed in an etching process thereof. On the other hand, the amorphous silicon film is formed to be 60 nm or more in thickness (preferably, from 100 to 200 nm) for operating the silicon film as a film of a partial depletion type. In addition, an amorphous silicon germanium ($Si_{1-x}Ge_x$; x=from 0.001 to 0.05) film may be applied instead of the amorphous silicon film.

Crystallization is performed by adding a metal element such as nickel (Ni) having a catalytic action for crystallization of a semiconductor. In FIG. 5(A), after holding a nickel (Ni) containing layer 204 on the amorphous silicon film 203, the crystallization is conducted by a heat treatment such as radiation heating or conductive heating. For example, RTA using a lamp source, or RTA (gas RTA) using a heated gas is performed for 180 seconds at the preset heating temperature of 740° C. The preset heating temperature is temperature shown by a temperature sensor (pyrometer) arranged near the substrate, and the temperature is set as the preset temperature in the heat treatment. As another method, a heat treatment using a furnace annealing oven at 550° C. for four hours may be adopted. Lowering temperature of crystallization temperature and time-shortening are caused by an action of a metal element having a catalytic action.

Next, as shown in FIG. 5(B), in order to further improve crystallinity of a crystalline silicon film 207, a laser anneal treatment is conducted by irradiating an excimer laser light or a second harmonic of a solid laser such as YLF laser, YVO4 laser or YAG laser of pulse oscillation. In the laser anneal treatment, laser light 206 with the laser oscillator as a light source are condensed linearly by an optical system and irradiated.

As described above, a crystalline silicon film 208 is formed (FIG. 5(C)). When pulsed laser light is emitted, there is a case where smoothness of a surface is lost. It is possible to realize the good smoothness of a surface by reducing many convex portions formed on the surface, by performing an oxidation treatment with a ozone water-containing aqueous solution and a treatment for removing an oxidized film with a hydrofluoric acid-containing aqueous solution once, and preferably repeating the processing plural times. In order to manufacture a TFT with a channel length of from 0.35 to 2.5 μm and to set a practical thickness of a gate insulating film to from 20 to 80 nm, a maximum value of unevenness is set to 10 nm or less, preferably 5 nm or less in relation to smoothness of the surface of the crystalline silicon film.

Gettering shown in FIG. 6 is performed to remove impurities such as metal included in the crystalline silicon film. The gettering is especially effective for reducing the concentration of the metal with the catalytic action, which is added intentionally in the crystallization step, to $1\times10^{17}/cm^3$ or less. It is necessary to newly form a gettering site in order to perform gettering on the crystalline silicon film formed in a thin-film state. In FIG. 6, as the gettering site, an amorphous silicon film 210 is formed over the crystalline silicon film 208 with a barrier layer 209 therebetween. The amorphous silicon film 210 is allowed to contain an impurity element such as phosphorous or boron, a noble gas element such as Ar, Kr, or Xe, or an element such as oxygen or nitrogen included at $1\times10^{20}/cm^3$ or more to form a distortion site. As a preferable deposition method, RF sputtering is performed with Ar as a sputtering gas to form the amorphous silicon film. The substrate heating temperature in deposition can be set arbitrarily, and for example, temperature of 150° C. is enough.

A heat treatment is performed by radiation heating or conductive heating. For example, RTA with a lamp as a light source or RTA (gas RTA) using a heated gas is performed at 750° C. for 180 seconds. Alternatively, a heat treatment at 550° C. for 4 hours is performed with a furnace annealing oven. With the heat treatment, segregation of the metal element to the amorphous silicon film 210 occurs, and it is possible to highly purify the crystalline silicon film 208 as a result. After the heat treatment, the amorphous silicon film 210 is removed by dry etching that uses $NF_3$ or $CF_4$, dry etching that uses non-plasma of $ClF_3$ or wet etching using alkali solution such as solution including hydrazine or tetra ethyl ammonium hydro oxide (chemical formula: $(CH_3)_4NOH$). The barrier layer 209 is removed by hydrofluoric acid etching.

After that, the obtained crystalline silicon film 208 is etched into a desired shape through photolithography and divided into island-like portions. A semiconductor layer 212 shown in FIG. 7(A) is thus formed and becomes a main structural part where the channel region or source/drain region of the TFT is formed. An impurity element imparting p-type conductivity and an impurity element imparting n-type conductivity are added to the semiconductor layer 212 in order to shift threshold value voltage to a positive value and a negative value, respectively.

Subsequently, a silicon oxide film 213 and a silicon nitride film 214 forming a gate insulating film are formed over the semiconductor layer 212 by RF sputtering using silicon as a target, followed by the heat treatment utilizing RTA within the same apparatus without exposing the resultant to air.

Prior to the film formation by sputtering, in order to clean the surface of the semiconductor layer 212, the oxidation treatment with the ozone water-containing aqueous solution is performed, and further, the treatment for removing the oxide film using the hydrofluoric acid-containing aqueous solution is performed, thereby etching the surface of the semiconductor layer 212 and terminating dangling bonds at the surface with hydrogen to obtain an inert state. Thereafter, the silicon oxide film is formed to have a thickness of from 10 to 60 nm by RF sputtering using a silicon target (B dope: from 1 to 10 Ωcm). Typical film formation conditions are as follows: the sputtering gas contains $O_2$ and Ar with a mixing ratio (flow rate) of 1:3; a pressure at the time of sputtering is 0.4 Pa; a discharge power is 4.1 $W/cm^2$ (13.56 MHz); and the substrate heating temperature is 200° C. Under such conditions, the fine silicon oxide film 213 can be formed with a low interface level density with the semiconductor layer. Also, prior to the deposition of the silicon oxide film, the surface treatment such as a heat treatment or an oxygen plasma treatment under the reduced pressure may be performed in a preheating chamber. If the surface is oxidized by the oxygen plasma treatment, the interface level density can be lowered. After that, the silicon nitride film 214 is formed with a thickness of from 10 to 30 nm by RF sputtering. Typical film formation conditions are as follows: the sputtering gas contains $N_2$ and Ar with a mixing ratio (flow rate) of 1:1; a pressure at the time of sputtering is 0.8 Pa; a discharge power is 4.1 W/cm² (13.56 MHz); and the substrate heating temperature is 200° C.

The gate insulating film of the laminate structure can substantially provide the same effects as those of the time when the film is thinned. This is because a relative dielectric constant of the silicon oxide is 3.8, whereas the relative dielectric constant of the silicon nitride is about 7.5. Considering the smoothness of the semiconductor layer surface, the maximum size of the concave and convex portions is set to 10 nm or less, preferably 5 nm or less. The gate insulating film takes a two-layer structure including the silicon oxide film and the silicon nitride film. Thus, even if the total thickness of the gate insulating film is set to from 30 to 80 nm, it is possible to reduce a gate leak current and to drive the TFT at from 2.5 to 10V, typically from 3.0 to 5.5V.

After the laminate comprising the silicon oxide film 213 and the silicon nitride film 214 is formed, a first light-absorbing layer (a first conductive layer) 215 is formed. The first light-absorbing layer (the first conductive layer) 215 is formed of a material selected from high melting-point metal such as molybdenum (Mo), tungsten (W), or titanium (Ti), metal nitride such as titanium nitride, tantalum nitride, or tungsten nitride, silicide such as tungsten silicide ($WSi_2$), molybdenum silicide ($MoSi_2$), titanium silicide ($TiSi_2$), tantalum silicide ($TaSi_2$), chromium silicide ($CrSi_2$), cobalt silicide ($CoSi_2$), or platinum silicide ($PtSi_2$), and polycrystalline silicon doped with phosphorous or boron.

The thickness of the first light-absorbing layer (the first conductive layer) 215 is set to from 10 to 100 nm, preferably from 20 to 50 nm. In the case where the first light-absorbing layer (the first conductive layer) 215 has a thickness of less than 10 nm, the emitted pulsed light cannot be absorbed sufficiently. When the first light-absorbing layer (the first conductive layer) 215 has a thickness of more than 100 nm, the semiconductor layer side is not heated sufficiently. Accordingly, it is preferable to adopt the value of the film thickness in the above range. FIG. 11(A) is a top view of this state, and a position where the first light-absorbing layer (the first conductive layer) 215 is to be formed, is to be arranged so that the position overlaps with a whole area of the semiconductor layer 212 and so that the end portions are arranged outside of the semiconductor layer 212.

As shown in FIG. 7(B), the local heating type heat treatment is performed by emitting pulsed light 216 using a pulsed laser oscillator as a light source. The heat treatment is performed under conditions of a repeated pulse frequency of from 5 to 300 Hz and an irradiated pulse energy density of from 100 to 500 mJ/cm² in the case of an excimer laser. The heat treatment is performed under conditions of a repeated pulse frequency of from 5 to 300 Hz and an irradiated pulse energy density of from 200 to 700 mJ/cm² in the case of an Nd:YAG laser. The pulse width is from 10 to 100 nanoseconds, and the number of pulse irradiation is from 1 to 30 times. The region where the first light-absorbing layer (the first conductive layer) 215 absorbing the pulsed light 216 is formed is more heated than the other region of the substrate 201, thereby making it possible to locally heat the insulating layers 213 and 214 and the semiconductor layer 212 with conductive heating from the first light-absorbing layer (the first conductive layer) 215. By this treatment, micro silicon cluster taken into the film is oxidized or nitrided, and further, the defect density in the film or interface level defect density can be reduced by relaxing the inside distortion.

After that, as shown in FIG. 7(C), as a second conductive layer 217, an element selected from the group consisting of tantalum (Ta), tungsten (W), titanium (Ti), molybdenum (Mo), aluminum (Al), and copper (Cu), or an alloy material or a compound material mainly containing the metal element is deposited. The first light-absorbing layer (the first conductive layer) 215 and the second light-absorbing layer (the second conductive layer) 217 are processed into a gate electrode. A preferable combination thereof is a combination of the first light-absorbing layer (the first conductive film) 215 made of a tantalum nitride (TaN) film and the second light-absorbing layer (the second conductive film) 217 made of tungsten (W), or a combination of the first light-absorbing layer (the first conductive layer) 215 made of a tantalum nitride (TaN) film and the second light-absorbing layer (the second conductive layer) 217 made of a titanium (Ti) film.

Subsequently, as shown in FIG. 8(A), a resist mask 223 is formed for forming a gate electrode pattern and then, a first etching treatment is conducted through dry etching. An inductively coupled plasma (ICP) etching method is, for example, adapted for etching. There is no limitation on an etching gas, but $CF_4$, $Cl_2$, and $O_2$ are used for etching for tungsten (W) or tantalum nitride (TaN). In the first etching treatment, a predetermined bias voltage is applied to the substrate side to incline the sides of first-shape gate electrode patterns 218 and 219 to be formed, at a tilt angle of from 15 to 50 degrees. Although it depends on the etching conditions, the silicon nitride film 214 formed as the gate insulating film by the first etching treatment remains under the first-shape gate electrode patterns 218 and 219, and the silicon oxide film 213 is exposed.

After that, the etching conditions are shifted to second etching conditions. The etching gas is changed to $SF_6$, $Cl_2$, and $O_2$ and the bias voltage applied to the substrate side is set to a predetermined value. Then, the tungsten (W) film undergoes anisotropic etching. Thus, a gate electrode is formed, which has a two-layer structure comprising the first light-absorbing layer (the first conductive layer) 218 and a second light-absorbing layer (a second conductive layer) 225 (FIG. (8)B).

Note that, in the steps shown in FIGS. 8(A) and 8(B), wirings 220 and 226 are formed from the same layer as the second light-absorbing layer (the second conductive layer). Therefore, as apparent from the comparison with top views of FIGS. 11(B) and 11(C), the wirings can be formed in succession to the gate electrode. Here, cross sectional views of the portion shown by broken lines in FIGS. 11(B) and 11(C) are each FIGS. 8(A) and 8(B). Note that, a resist mask over the second light-absorbing layer is omitted for description.

The gate electrode is a laminate structure comprising the first light-absorbing layer (the first conductive layer) 218 and the second light-absorbing layer (the second conductive layer) 225. As viewed in section, the gate electrode takes a structure (top-hat structure) in which the first light-absorbing layer (the first conductive layer) 218 protrudes outwardly like eaves. Then, as shown in FIG. 8(C), a doping treatment is performed. According to the doping method including accelerating the impurity ions for controlling valence electrons by the electric field and injecting the ions, it is also possible to vary the concentration of an impurity region to be formed in the semiconductor layer 212 by appropriately adjusting an acceleration voltage of the ions. In other words, the impurity ions of one conductivity type are injected at the acceleration voltage high enough to allow the ions to pass through the eaves portion of the first light-absorbing layer (the conductive layer) 218, thereby forming a first impurity region 227 overlapping with the gate electrode. Thereafter, as shown in FIG. 8(D), the ions of one conductivity type are injected at the acceleration voltage low enough to prevent the impurity ions from passing through the eaves portion of the first light-absorbing layer (the first conductive layer) 218, thereby forming a second impurity region 228. Through such doping method, a TFT having a so-called gate overlap LDD structure can be formed.

Regarding the one conductivity type impurity, in the case of an n-type impurity (donor), an element such as phosphorous or arsenic belonging to Group 15 in the periodic table is used, whereas in the case of a p-type impurity (acceptor), an element such as boron belonging to Group 13 in the periodic table is used. By appropriately selecting the impurities, an n-channel or p-channel TFT can be formed. Also, the n-channel TFT and the p-channel TFT can be easily integrated onto the same substrate by solely using the additional mask patterns for the doping.

The activation of the second impurity region 228 where the source/drain region is to be formed and the first impurity region 227 where the LDD region is to be formed is achieved by laser annealing through the irradiation of a pulsed laser or continuous wave laser 229 (FIG. 8(E)). It is possible to activate the above regions by furnace annealing capable of heating to 500° C. or higher. After the position of the gate is determined, however, it is preferable to prevent the substrate 201 from shrinking through heating, in order not to affect the mask alignment in the subsequent step. Accordingly, at this stage, laser annealing or flash lamp annealing is suitably adopted since the laser annealing or flash lamp annealing can perform the activation without heating the substrate 201. In particular, in order to process the regions with the channel length set to from 0.3 to 1.5 μm, it is necessary to finish the heat treatment in very short time, and prevent impurity diffusion from source and drain so that the channel length can be a predetermined value.

As shown in FIG. 9(A), a silicon oxynitride film containing hydrogen is formed as a third insulating layer 230 by plasma CVD using a mixed gas of $SiH_4$, $N_2O$, $NH_3$, and $H_2$ at the substrate heating temperature of 325° C. The film thickness is set to from 50 to 200 nm. Thereafter, the semiconductor layer is hydrogenated by the heat treatment in a nitrogen atmosphere at 410° C.

After that, contact holes are formed in the third insulating layer 230 and wirings 231 are formed of Al, Ti, Mo, W, etc., as appropriate. A given example of a wiring structure is a laminate structure comprising a Ti film with a thickness of from 50 to 250 nm and an alloy film (Al—Ti alloy film) with a thickness of from 300 to 500 nm (FIG. 9(B)).

According to the steps of this embodiment, the heat treatment required in the step of forming the gate portion of the TFT is performed such that the portion where the semiconductor layer is formed is uniformly heated, whereas the other portions are less heated. Thus, the glass substrate shrinkage does not occur. Accordingly, the accuracy in size of the gate portion and its vicinity is secured and the TFT with a channel length of from 0.3 to 1.5 μm can be formed over the glass substrate.

In this way, the TFT of the gate overlap LDD structure can be completed. By applying a laminate to the gate insulating film of the TFT, the TFT exhibiting less variation in threshold voltage or subthreshold characteristic can be obtained. The above laminate is obtained by laminating the silicon oxide film and the silicon nitride film formed by RF sputtering using silicon as a target and performing the heat treatment such that the resulting product is locally heated using a light-absorbing layer formed by patterning. That is, the gate insulating film can be formed of the fine silicon oxide film or the laminate including the silicon oxide film and the silicon nitride film, each of which contains neither hydrogen nor fixed charge or the like due to the heat treatment, which can contribute to the realization of the stable TFT characteristics.

Also, according to this embodiment, a gate wiring connected with the gate electrode is formed from the second light-absorbing layer (the second conductive layer), so that a wiring width can be freely set (no eaves of the lower light-absorbing layer exists) and the wirings can be arranged at the high density.

EMBODIMENT 2

Similarly to Embodiment 1, the steps up to the hydrogenation step shown in FIG. 9(A) are performed. After that, as shown in FIG. 10(A), a fourth insulating layer 232 is formed over a third insulating layer 230 by using a silicon nitride film formed by RF sputtering using the silicon target. The silicon nitride film is superior in barrier property, which can thus provide a blocking effect of preventing intrusion of oxygen, moisture in the air, ionic impurity such as sodium, and the like.

Further, a fifth insulating layer 233 is formed of a photosensitive or non-photosensitive organic resin material containing acryl, polyimide, or the like as a main constituent. Wirings 234 formed of a conductive material such as Al, Ti, Mo, W, etc. are provided in accordance with each contact hole formed in the third to fifth insulating layers. By forming the fifth insulating film using the organic resin material, the capacitance between the wirings is reduced and the smooth surface is achieved. As a result, the high-density arrangement of the wirings can be realized on this layer.

EMBODIMENT 3

This embodiment describes a mode where a TFT of a gate overlap LDD structure is formed through the steps different from those of Embodiment 1. Note that, in the description hereinafter, the same reference numerals showing the same elements as those of Embodiment 1 are used, and the description thereof is omitted for simplification.

In FIG. 14(A), a first insulating layer 202 and a semiconductor layer 212 are formed over a substrate 201, and a mask 240 is formed thereover. Thereafter, a first impurity region 241 is formed through a doping treatment.

After the mask 240 is peeled off and the organic contaminant is removed through a cyclic washing treatment alternately using ozone water and hydrofluoric acid or an ultraviolet (UV) ozone treatment to form the clean surface, a silicon oxide film 213, a silicon nitride film 214, and a light-absorbing layer 215 are formed.

At this stage, as shown in FIG. 14(B), a local heating type heat treatment may be performed. The local heating type heat treatment is performed by emitting pulsed light 216 using a pulsed laser oscillator as a light source. The heat treatment is performed under conditions of a repeated pulse frequency of from 5 to 300 Hz and an irradiated pulse energy density of from 100 to 500 mJ/cm$^2$ in the case of an excimer laser. The heat treatment is performed under conditions of a repeated pulse frequency of from 5 to 300 Hz and an irradiated pulse energy density of from 200 to 700 mJ/cm$^2$ in the case of an Nd:YAG laser. The pulse width is from 10 to 100 nanoseconds, and the number of pulse irradiation is from 1 to 30 times. The region where the first light-absorbing layer (the first conductive layer) 215 absorbing the pulsed light 216 is formed is more heated than the other region of the substrate 201, thereby making it possible to locally heat the insulating layers 213 and 214 and the semiconductor layer 212 with conductive heating from the first light-absorbing layer (the first conductive layer) 215. By this treatment, micro silicon cluster taken into the film is oxidized or nitrided, and further, the defect density in the film or interface level defect density is reduced by relaxing the inside distortion. Also, impurities doped into a first impurity region 241 can be activated. Further, junction property of the first impurity region 241 and a channel forming region 242 can be enhanced.

It should be noted that the heat treatment is skipped at this stage, but a local heating type heat treatment may be performed at the stage shown in FIG. 15(B).

After that, a second conductive layer 217 is formed to be from 100 to 500 nm thick from titanium (Ti), tungsten (W), aluminum (Al), etc. (FIG. 14(C)).

A second conductive layer 243 is patterned into a gate electrode. The gate electrode is formed at a position corresponding to the position where the mask 240 is formed so as to overlap with the first impurity region 241, thereby forming the gate overlap structure at this stage (FIG. 14(D)).

Next, as shown in FIG. 15(A), in the state where the first light-absorbing layer (the first conductive layer) 215 is left, a doping treatment is conducted using the second conductive layer 243 as the mask to form a second impurity region 244.

Thereafter, a local heating type heat treatment may be performed for the purpose of achieving the activation of a first impurity region 245 and the second impurity region 244 and the modification of the gate insulating film as shown in FIG. 15(B). When the heat treatment is performed at this stage, the light-absorbing layer (the first conductive layer) 215 absorbs pulsed light to enable the local heating. Through the heat treatment, both of the modification of the gate insulating film and the activation of the first impurity region 245 and the second impurity region 244 can be performed at the same time.

Thereafter, the light-absorbing layer (the first conductive layer) 215 is etched to form a gate electrode comprising a light-absorbing layer (a first conductive layer) 246 and the second light-absorbing layer (the second conductive layer) 243 (FIG. 15(C)).

The following steps are performed in the same way as that of Embodiment 1 to complete a TFT. According to this embodiment, the activation of the impurity regions is enhanced by overlapping the light-absorbing layer with the impurity region that is formed in the semiconductor layer and by irradiating the resultant product with pulsed light resulting in lowering resistance, as well as the modification of the gate insulating film.

EMBODIMENT 4

This embodiment describes a mode where a TFT of a gate overlap LDD structure is formed through the steps different from those of Embodiment 3. Note that, in the description hereinafter, the same reference numerals showing the same elements as those of Embodiment 3 are used, and the description thereof is omitted for simplification.

First, similarly to Embodiment 1, up to the steps shown in FIG. 7(C) are performed. And a second conductive layer 217 is etched to form a gate electrode shape. After that, as shown in FIG. 12(A), a second conductive layer 250 is used as the mask at the doping time. A first impurity region 241 doped with the one conductivity type impurity through a first light-absorbing layer (a first conductive layer) 215 is formed in a self-alignment manner.

Next, an insulating layer of a silicon oxide film or the like is formed over the first light-absorbing layer (the first conductive layer) 215 and the second light-absorbing layer (the second conductive layer) 250, and a side spacer 251 is formed by anisotropic etching. The side spacer 251 and the second light-absorbing layer (the second conductive layer) 250 are used as the mask at the doping time. A second impurity region 244 doped with the one conductivity type impurity through the first light-absorbing layer (the first conductive layer) 215 is formed in a self-alignment manner (FIG. 12(B)).

A local heating type heat treatment is performed after a first impurity region 245 and the second impurity region 244 are formed (FIG. 12(C)). The local heating type heat treatment is performed by emitting pulsed light 216 using a pulsed laser oscillator as a light source as the heat treatment. The heat treatment is performed under conditions of a repeated pulse frequency of from 5 to 300 Hz and an irradiated pulse energy density of from 100 to 500 mJ/cm$^2$ in the case of an excimer laser. The heat treatment is performed under conditions of a repeated pulse frequency of from 5 to 300 Hz and an irradiated pulse energy density of from 200 to 700 mJ/cm$^2$ in the case of an Nd:YAG laser. The pulse width is from 10 to 100 nanoseconds, and the number of pulse irradiation is from 1 to 30 times. The region where the first light-absorbing layer (the first conductive layer) 215 absorbing the pulsed light 216 is formed is more heated than the other region of a substrate 201, thereby making it possible to locally heat insulating layers 213 and 214 and a semiconductor layer 212 with conductive heating from the first light-absorbing layer (the first conductive layer) 215. By this treatment, impurities doped into the first impurity region 245 and the second impurity region 244 can be activated. Further, junction property of the first impurity region 245 and a channel forming region 242 can be enhanced.

Thereafter, the first light-absorbing layer (the first conductive layer) 215 is etched to form a gate electrode comprising a first light-absorbing layer (a first conductive layer) 246 and the second light-absorbing layer (the second conductive layer) 250 (FIG. 12(D)).

The following steps are performed in the same way as that of Embodiment 1 to complete a TFT. This embodiment is particularly suitable for a TFT having a channel length of 1 μm or less, because the width (the width in the channel length direction) of the first impurity region overlapping with the gate electrode is controlled by the side spacer. The local heating type heat treatment of the present invention can solve the problem on process that impurities diffuse into a channel portion from the formed impurity region and a channel becomes shorter than a predetermined value, even if the channel becomes shorter. The activation of the impurity regions is enhanced by overlapping the light-absorbing layer with the impurity region that is formed in the semiconductor layer and by irradiating the resultant product with pulsed light, resulting in lowering resistance.

EMBODIMENT 5

In Embodiment 1, after the crystalline silicon film 207 shown in FIG. 5(B) is obtained, as shown in FIG. 13, a laser oscillator using crystal such as YAG, YVO$_4$, YLF, or YAlO$_3$, which is doped with Cr, Nd, Er, Ho, Ce, Co, Ti, or Tm is adapted for the continuous wave solid state laser. A fundamental wave of the laser oscillator varies depending on the doped material, but the laser light with the fundamental wave of around 1 μm is obtained. Any higher harmonics with respect to the fundamental wave can be obtained by using a nonlinear optical element. When the above laser oscillator is used, the wavelength within the visible light region and the wavelength within the UV region can, generally, be obtained with the second harmonic and the third harmonic, respectively. Typically, in an Nd:YVO$_4$ laser oscillator (fundamental wave: 1064 nm), the second harmonic (532 nm) thereof is adapted. The laser light is condensed into a linear or rectangular shape and scanned at a scanning rate of from 1 to 100 cm/sec, thereby improving the crystallinity.

In this step, the application of the continuous wave laser enables the crystal grain to grow in the laser light scanning direction to obtain the crystalline silicon film with a smooth surface. As a result, the maximum size of the concave and convex portions on the surface can be suppressed to 10 nm or less, preferably 5 nm or less. Needless to say, this embodiment is applicable to Embodiments 1 to 4.

EMBODIMENT 6

An embodiment of a microcomputer as a typical semiconductor device manufactured according to Embodiments 1 to 5 will be described with reference to FIGS. 16 and 17. As shown in FIG. 16, the microcomputer can be realized by integrating various functional circuit portions on a glass substrate with a thickness of from 0.3 to 1.1 mm. The various functional circuit portions can be formed by mainly using TFTs and capacitor portions formed according to Embodiments 1 to 5.

Components of a microcomputer (MPU) 700 shown in FIG. 16 include a CPU 701, a ROM 702, an interruption controller 703, a cache memory 704, a RAM705, a DMAC 706, a clock generator circuit 707, a serial interface 708, a power generator circuit 709, an ADC/DAC 710, a timer counter 711, a WDT 712, an I/O port 713, and the like.

As shown in FIG. 17, the microcomputer (MPU) 800 formed over a glass substrate is fixedly bonded to a base 801 made of ceramics or fiber-reinforced plastics (FRP) by face down bonding. A highly conductive aluminum oxynitride 803 covers the backside of the glass substrate having the microcomputer 800, thereby enhancing a heat diffusion effect. Further, a radiation fin 804 made of aluminum is arranged to be in contact therewith to cope with the heat generated in association with the operation of the microcomputer 800. The whole part is covered with a sealing resin 805 and connection with an external circuit is achieved through pins 802.

In this embodiment, the mode of the microcomputer is shown as one example. However, a semiconductor device of various functions such as a media processor, a graphics LSI, a coding LSI, a memory, a graphics LSI, or an LSI for a portable phone can be completed by changing the structure or combination of the various functional circuits.

Figure 1A:
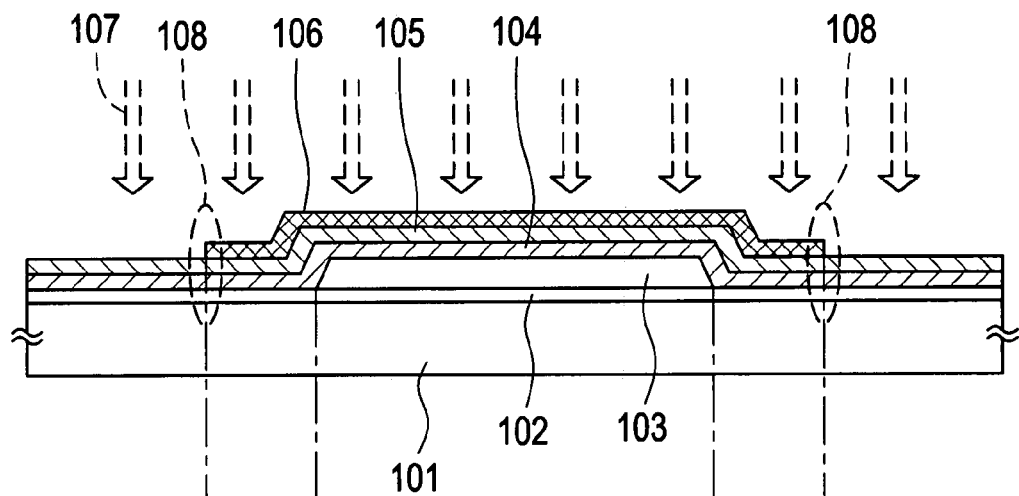
[FIG. 1] Explanatory views each showing a heat treatment method based on local heating according to the present invention.
Figure 1B:
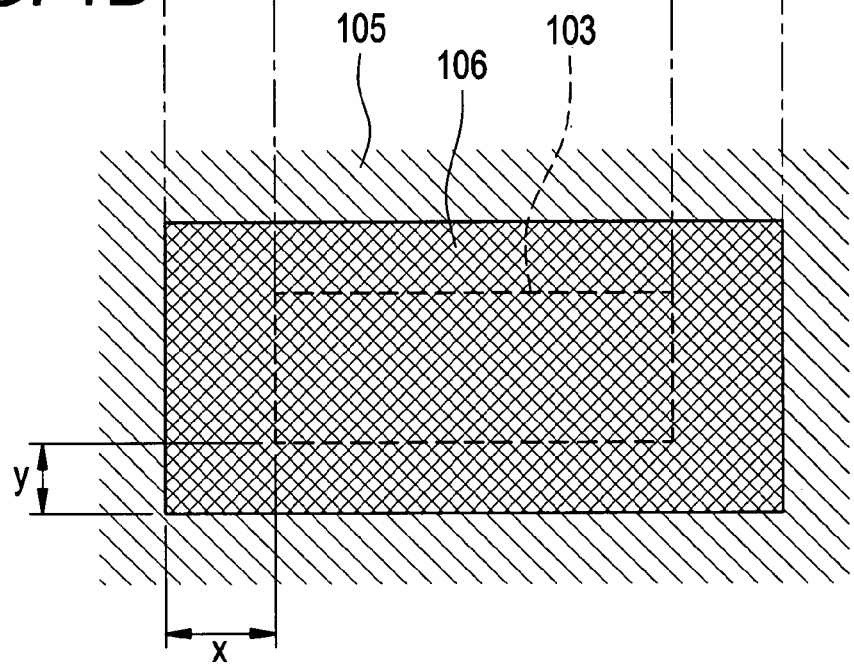
Figure 2A:
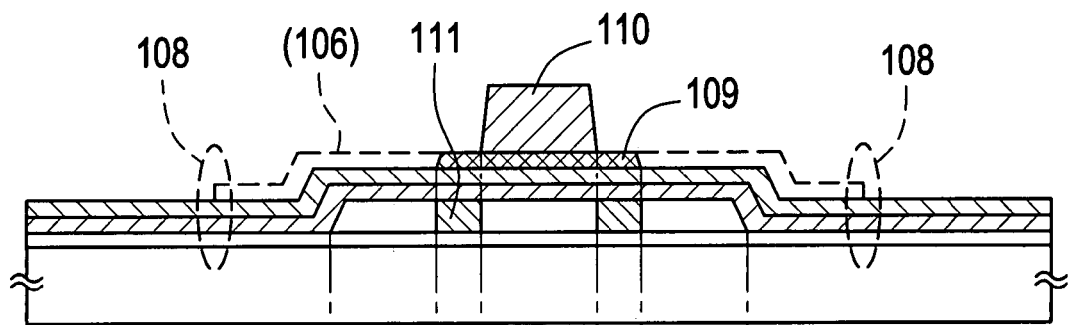
[FIG. 2] Explanatory views each showing a portion where a gate is formed after heat treatment of FIG. 1.
Figure 2B:
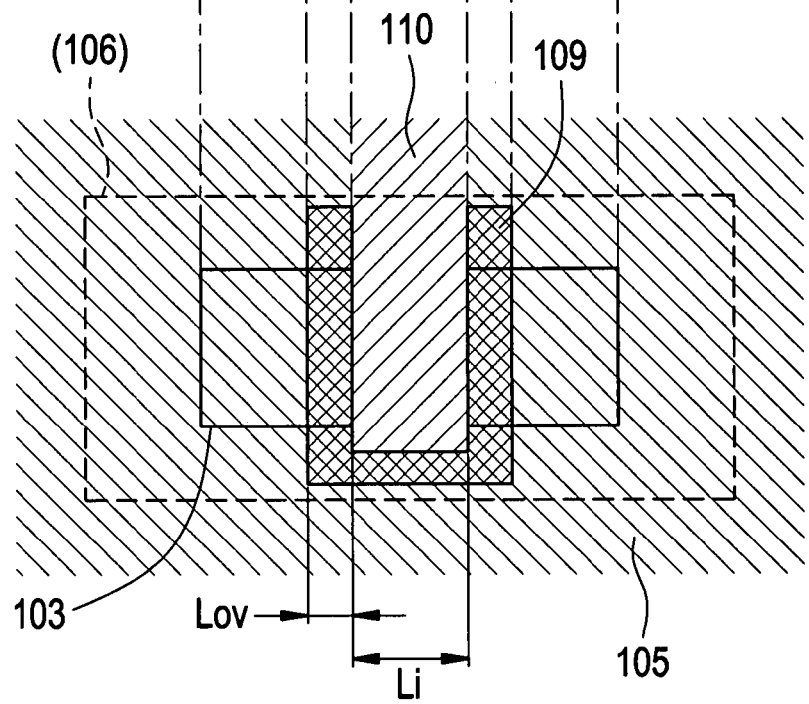
Figure 3:
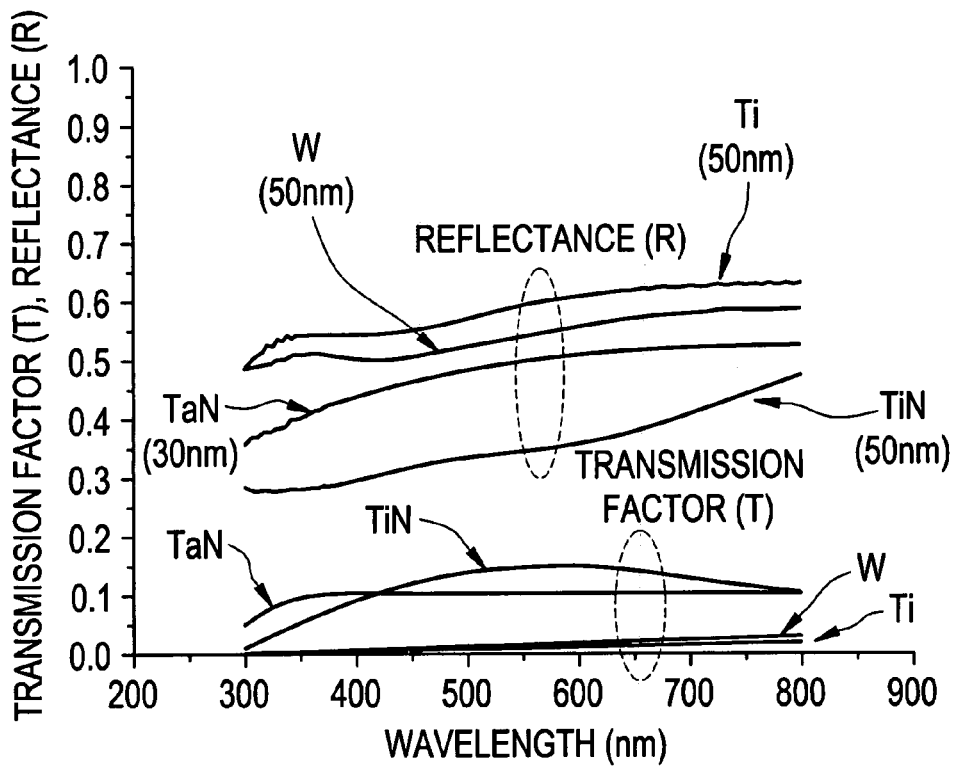
[FIG. 3] A graph showing each transmission factor and reflectance of W, Ti, TiN, and TaN formed over a glass substrate.
Figure 4:
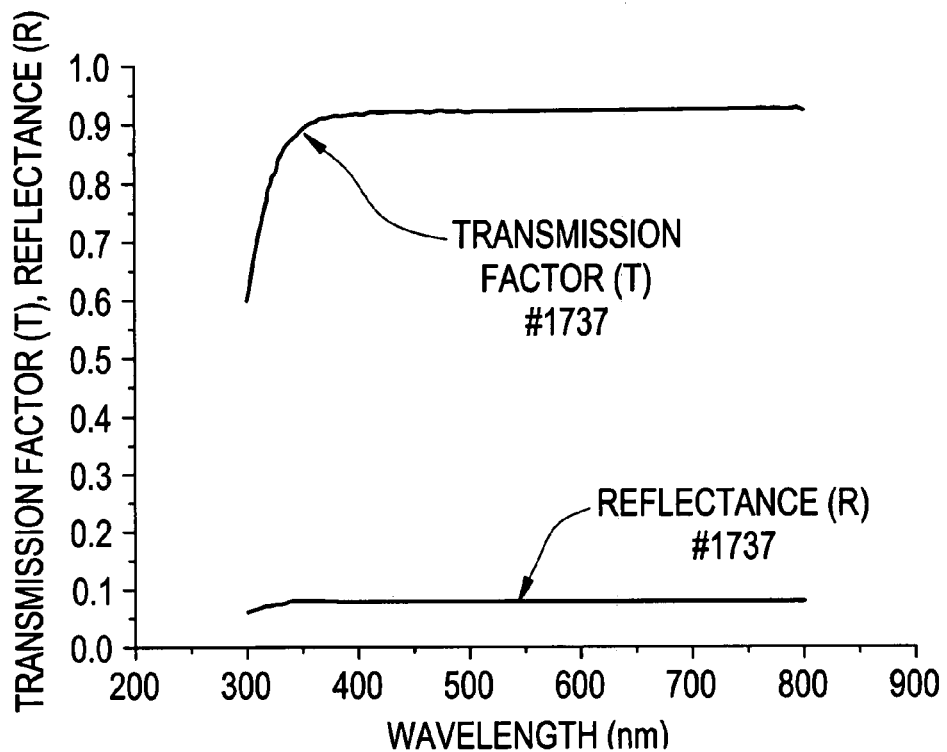
[FIG. 4] A graph showing transmission factor and reflectance of a glass substrate.
Figure 5A:
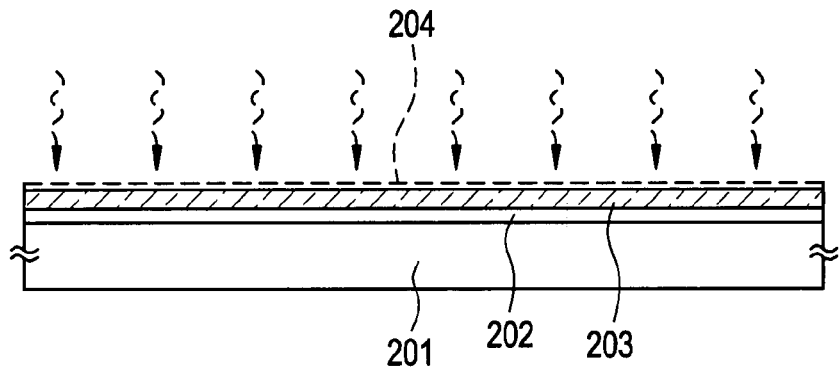
[FIG. 5] Explanatory views each showing a method for manufacturing a semiconductor device according to the present invention.
Figure 5B:
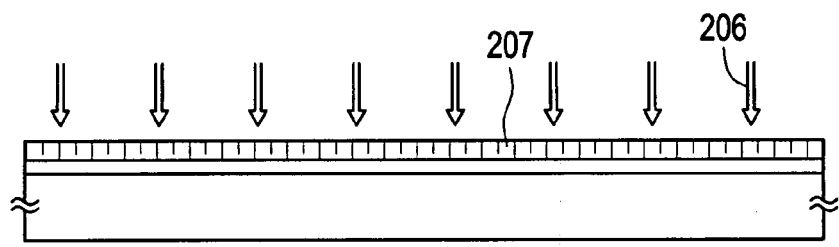
Figure 5C:
Figure 6:
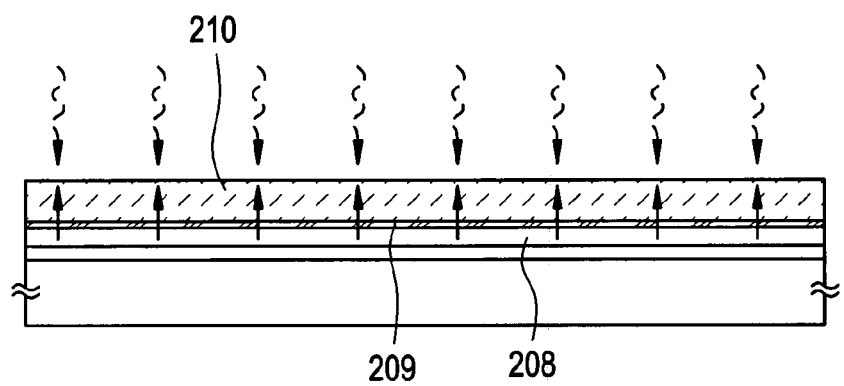
[FIG. 6] Explanatory view showing a method for manufacturing a semiconductor device according to the present invention.
Figure 7A:
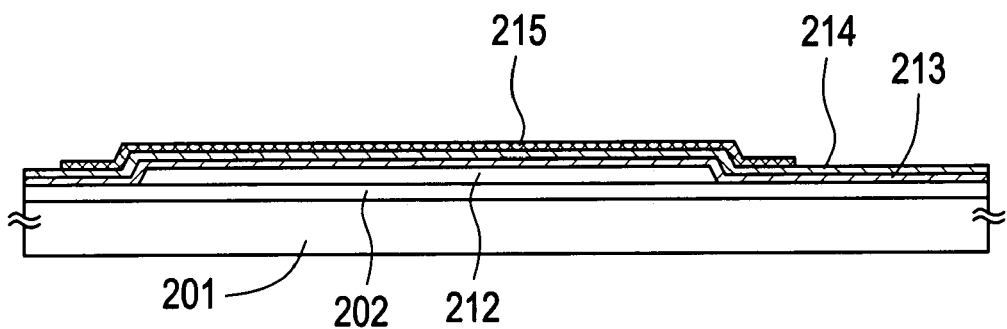
[FIG. 7] Explanatory views each showing a method for manufacturing a semiconductor device according to the present invention.
Figure 7B:
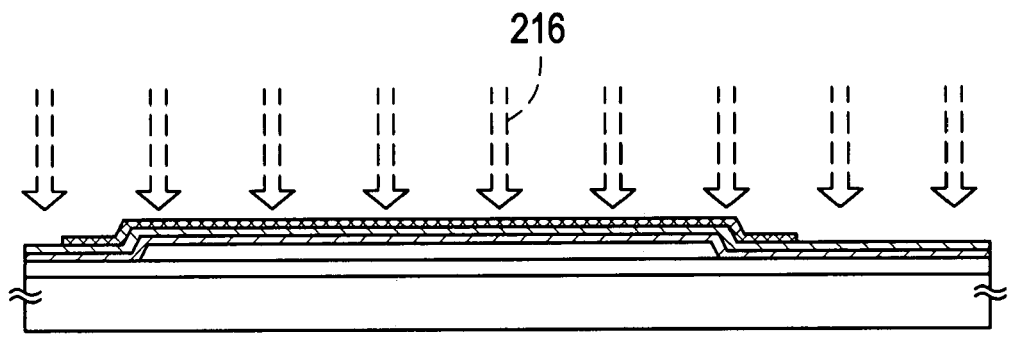
Figure 7C:
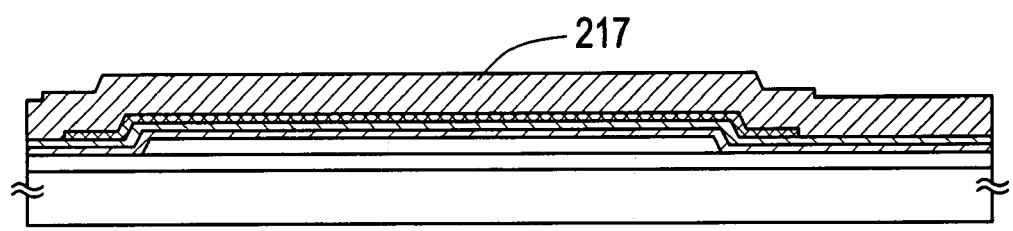
Figure 8A:
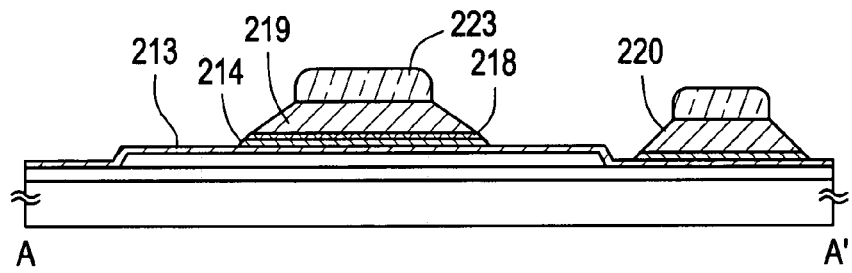
[FIG. 8] Explanatory views each showing a method for manufacturing a semiconductor device according to the present invention.
Figure 8B:
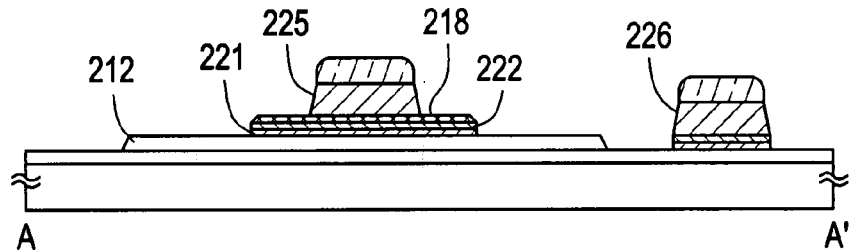
Figure 8C:
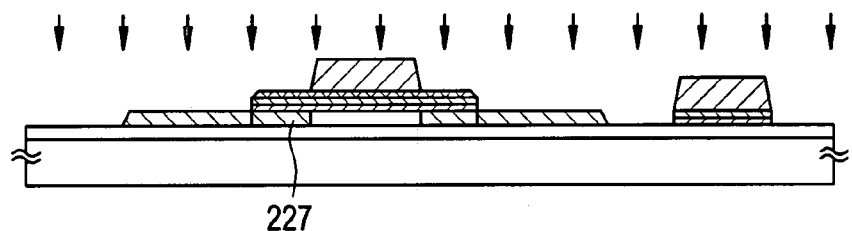
Figure 8D:
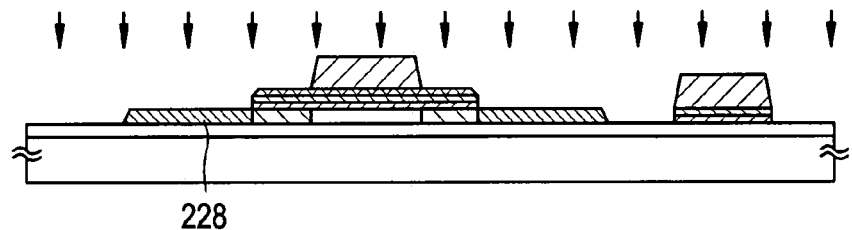
Figure 8E:
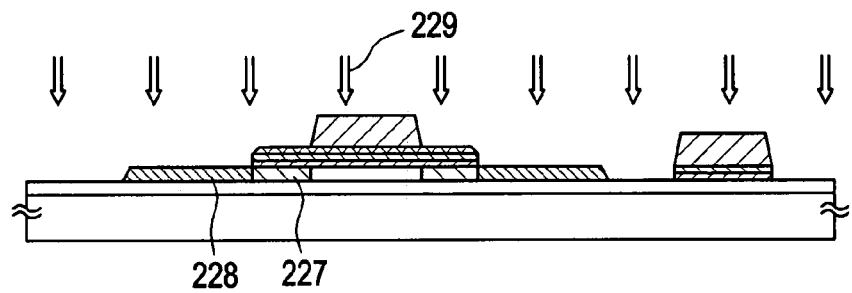
Figure 9A:
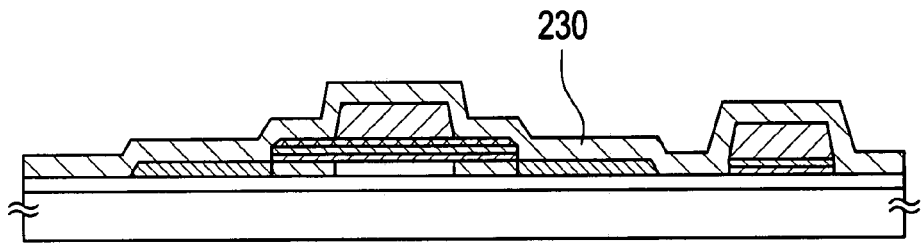
[FIG. 9] Explanatory views each showing a method for manufacturing a semiconductor device according to the present invention.
Figure 9B:
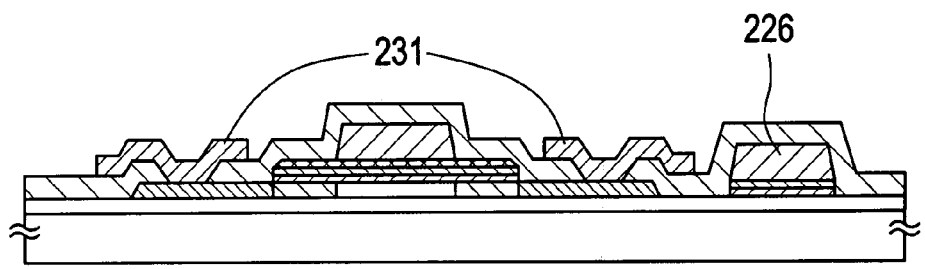
Figure 10A:
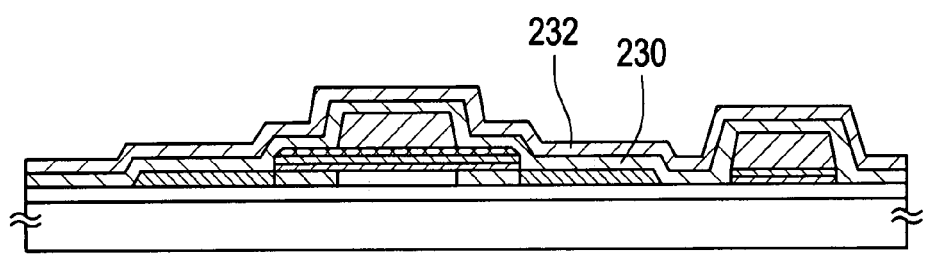
[FIG. 10] Explanatory views each showing a method for manufacturing a semiconductor device according to the present invention.
Figure 10B:
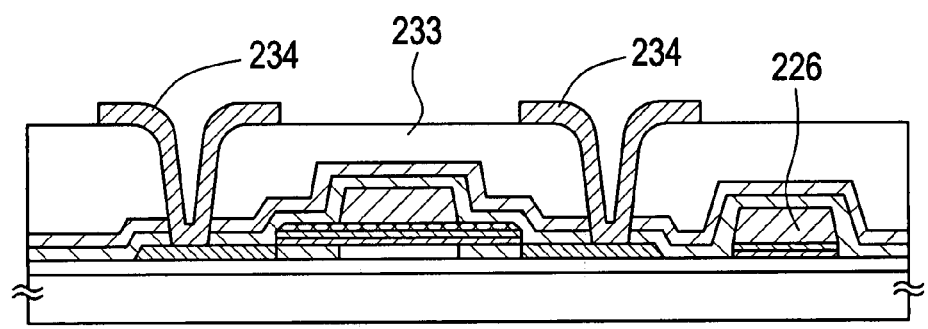
Figure 11A:
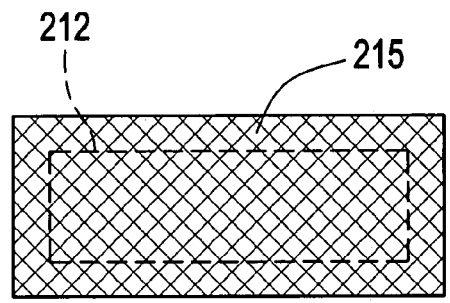
[FIG. 11] Explanatory views each showing a method for manufacturing a semiconductor device according to the present invention.
Figure 11B:
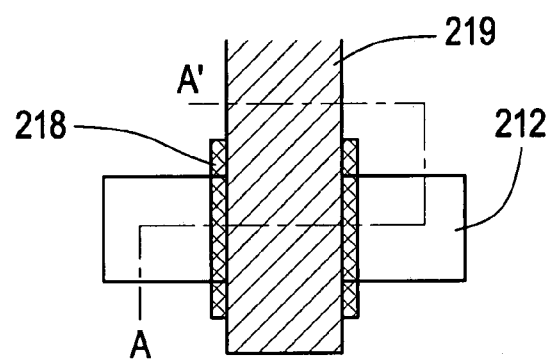
Figure 11C:
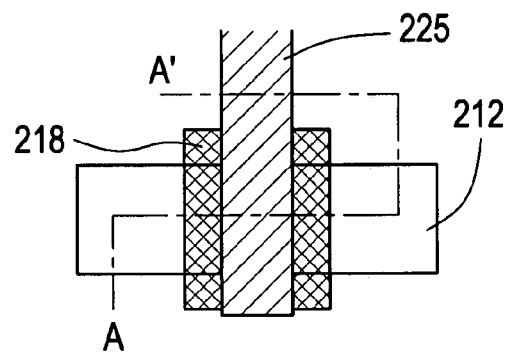
Figure 12A:
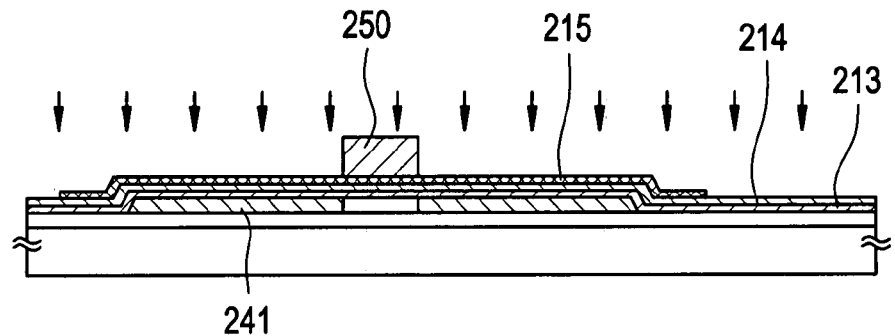
[FIG. 12] Explanatory views each showing a method for manufacturing a semiconductor device according to the present invention.
Figure 12B:
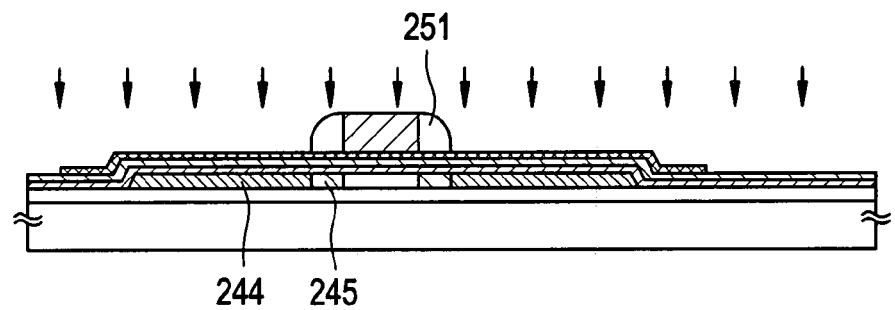
Figure 12C:
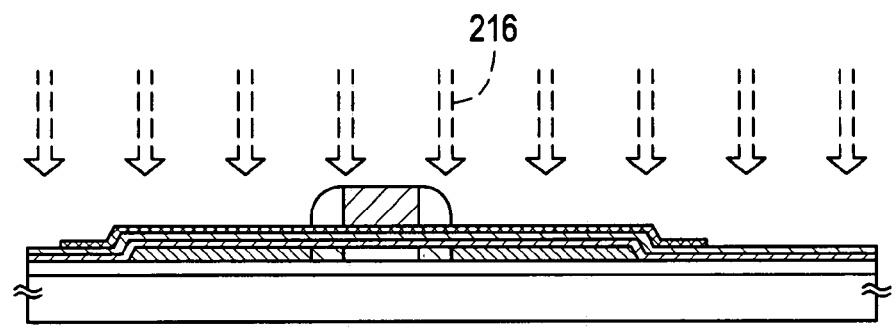
Figure 12D:
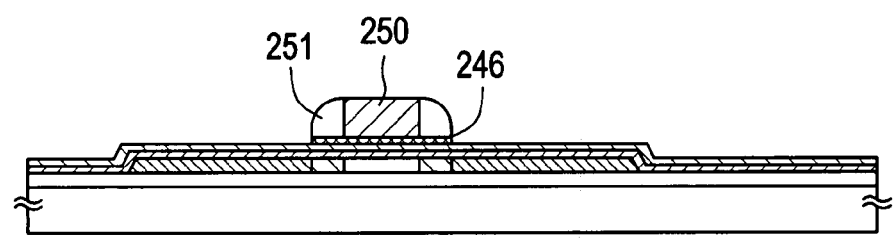
Figure 13:
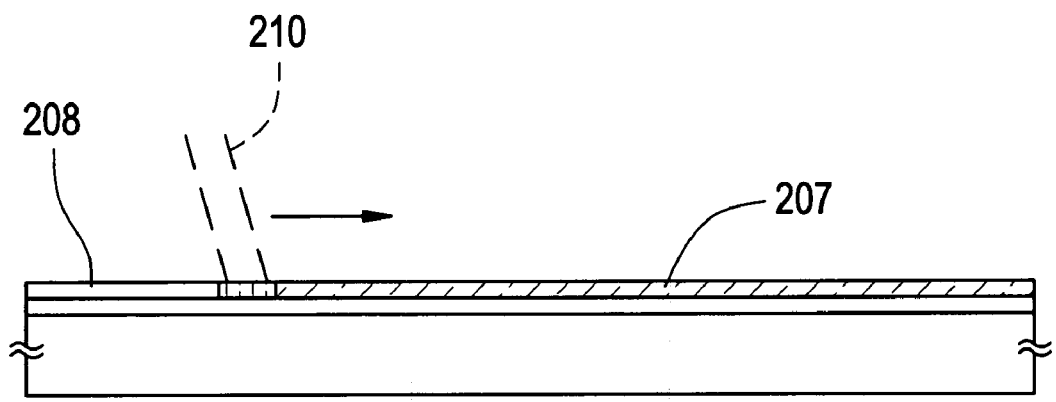
[FIG. 13] Explanatory view showing a: method for manufacturing a semiconductor device according to the present invention.
Figure 14A:
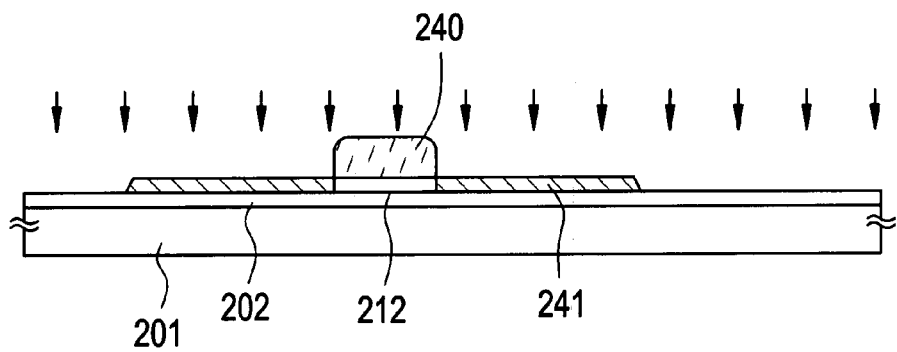
[FIG. 14] Explanatory views each showing a method for manufacturing a semiconductor device according to the present invention.
Figure 14B:
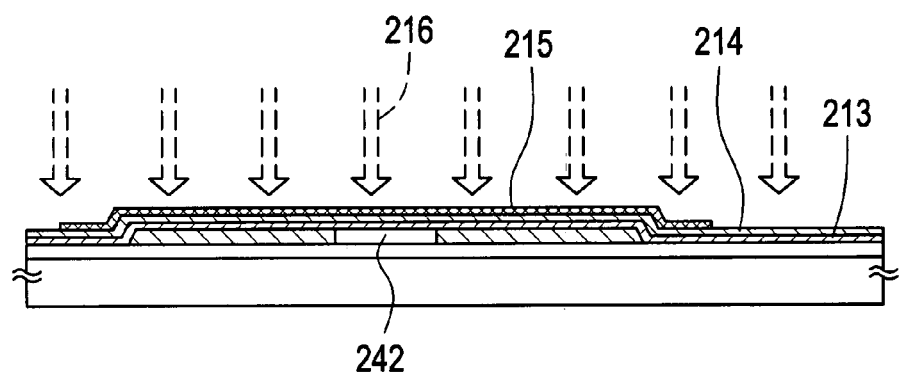
Figure 14C:
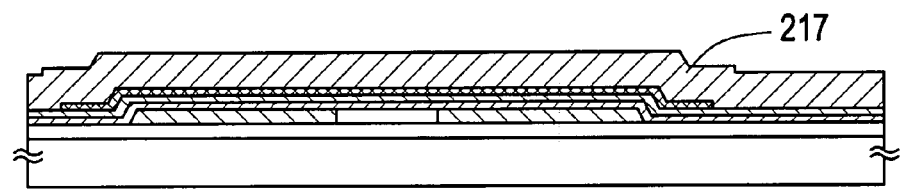
Figure 14D:
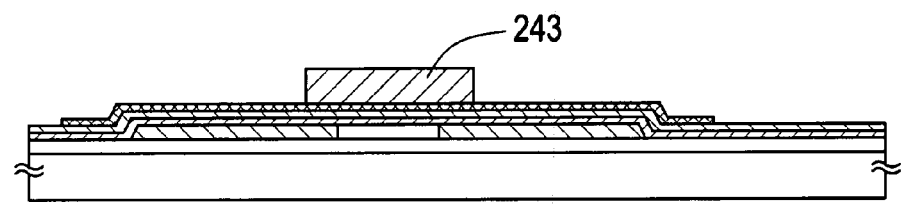
Figure 15A:
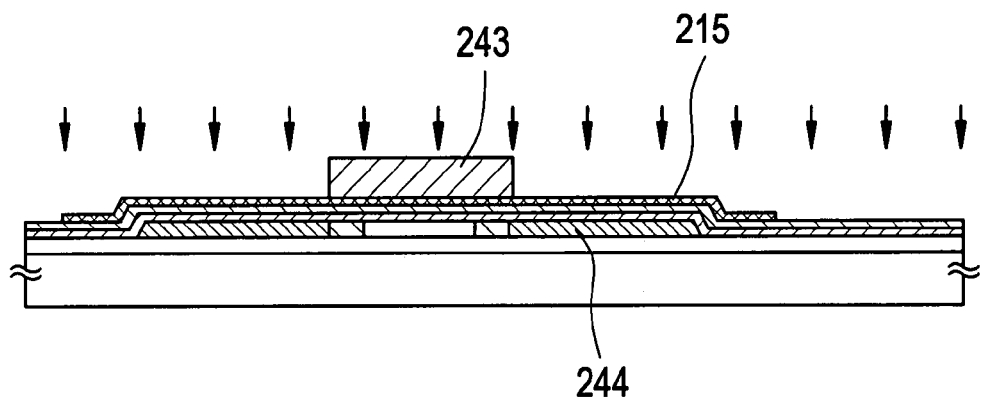
[FIG. 15] Explanatory views each showing a method for manufacturing a semiconductor device according to the present invention.
Figure 15B:
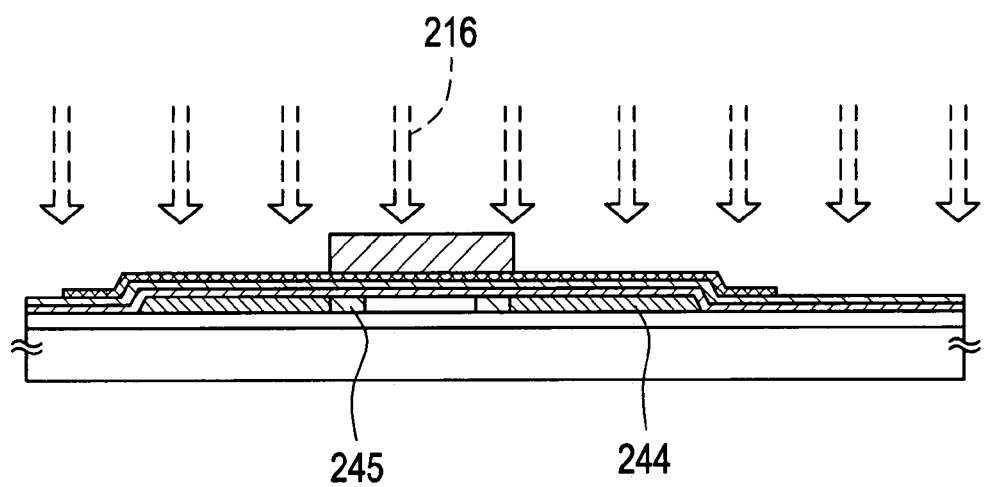
Figure 15C:
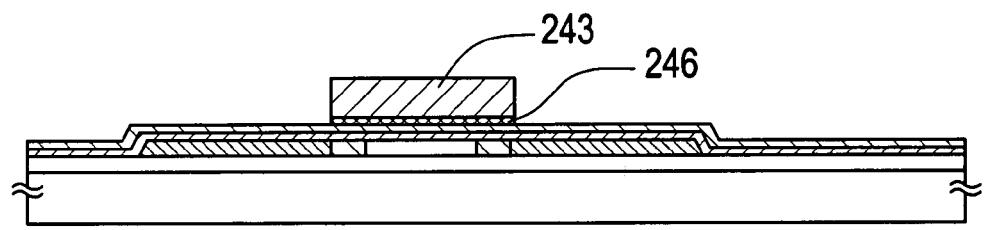
Figure 16:
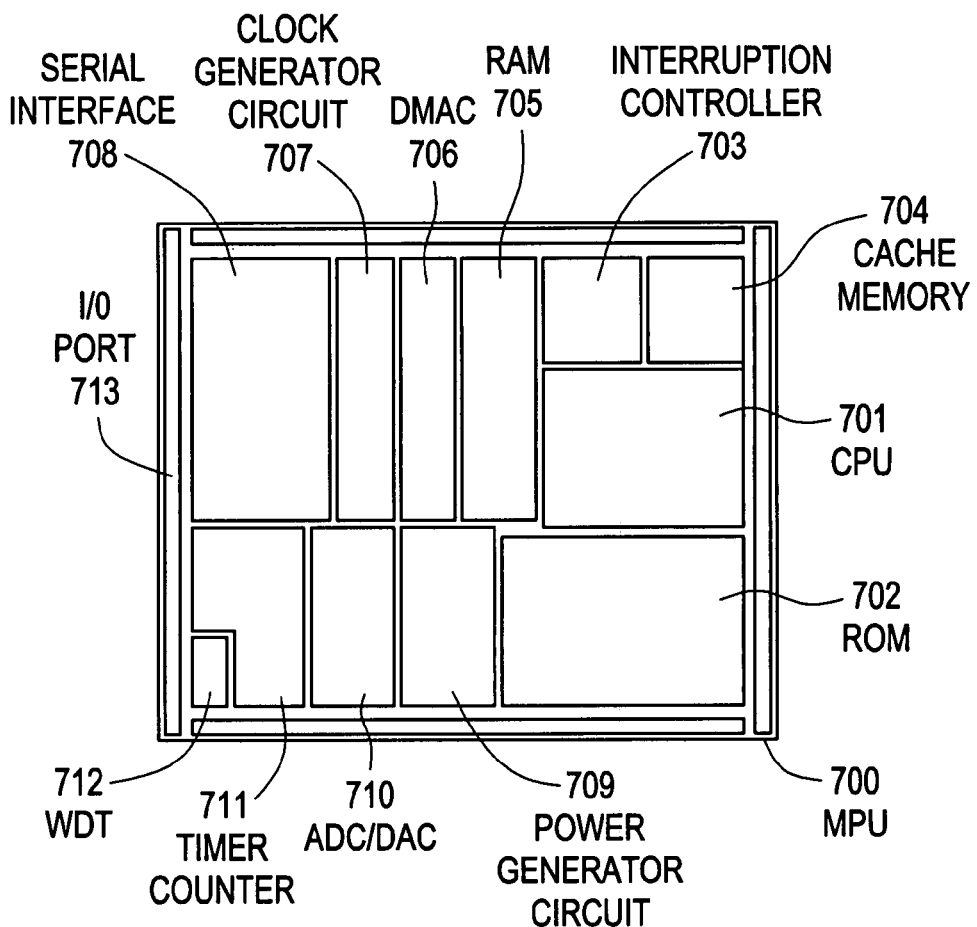
[FIG. 16] Explanatory view showing a structure of a microcomputer according to the present invention.
Figure 17:
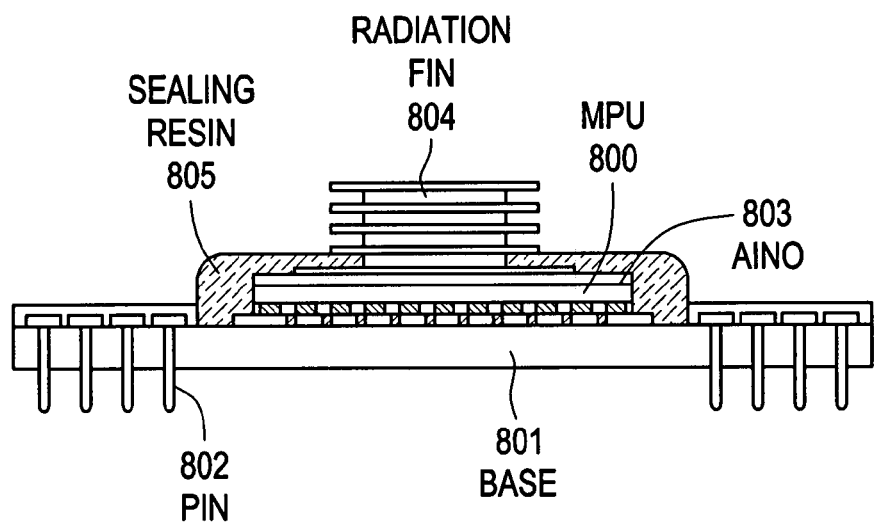
[FIG. 17] Explanatory view showing a package structure of a microcomputer according to the present invention.

What is claimed is:

1. A method for manufacturing a semiconductor device, comprising:

forming a semiconductor layer over a glass substrate;

forming an insulating layer over the semiconductor layer;

forming an island-like light-absorbing layer over the semiconductor layer with the insulating layer interposed therebetween, so that the island-like light-absorbing layer covers the semiconductor layer and end portions of the island-like light-absorbing layer are arranged outside of the semiconductor layer, said island-like light-absorbing layer being capable of absorbing a pulsed light;

performing a heat treatment for the semiconductor layer and the insulating layer by selectively heating the light-absorbing layer through an irradiation of the pulsed light; and patterning the light-absorbing layer and the insulating layer to form a gate insulating layer between the semiconductor layer and the patterned light-absorbing layer after performing the heat treatment.

2. A method for manufacturing a semiconductor device, comprising:

forming a semiconductor layer over a glass substrate;

forming an insulating layer over the semiconductor layer;

forming an island-like light-absorbing layer over the semiconductor layer with the insulating layer interposed therebetween so that the island-like light-absorbing layer covers the semiconductor layer and end portions of the island-like light-absorbing layer are arranged outside of the semiconductor layer wherein a transmission factor of a pulsed light by the island-like light-absorbing layer is 70 percent or less and a transmission factor of the pulsed light by the glass substrate is 70 percent or more;

performing a heat treatment for the semiconductor layer and the insulating layer by selectively heating the light-absorbing layer through an irradiation of the pulsed light; and patterning the light-absorbing layer and the insulating layer to form a gate insulating layer between the semiconductor layer and the patterned light-absorbing layer after performing the heat treatment.

3. A method for manufacturing a semiconductor device comprising:

forming a semiconductor layer over a glass substrate;

forming an insulating layer over the semiconductor layer;

forming an island-like light-absorbing layer over the semiconductor layer with the insulating layer interposed therebetween so that the island-like light-absorbing layer covers the semiconductor layer and end portions of the island-like light-absorbing layer are arranged outside of the semiconductor layer wherein a length of one side of the light-absorbing layer is equal to or less than a thickness of the glass substrate;

performing a heat treatment for the semiconductor layer and the insulating layer by selectively heating the light-absorbing layer through an irradiation of a pulsed light; and patterning the light-absorbing layer and the insulating layer to form a gate insulating layer between the semiconductor layer and the patterned light-absorbing layer after performing the heat treatment.

4. A method for manufacturing a semiconductor device comprising:

forming a semiconductor layer over a glass substrate;

forming an insulating layer over the semiconductor layer;

forming and patterning an island-like light-absorbing layer over the semiconductor layer with the insulating layer interposed therebetween so that the island-like light-absorbing layer covers the semiconductor layer and end portions of the island-like light-absorbing layer are arranged outside of the semiconductor layer, wherein a transmission factor of pulsed light by the island-like light-absorbing layer is 70 percent or less and a transmission factor of the pulsed light by the glass substrate is 70 percent or more;

performing a heat treatment for the semiconductor layer and the insulating layer by selectively heating the light-absorbing layer through an irradiation of the pulsed light; and patterning the light-absorbing layer and the insulating layer to form a gate insulating layer between the semiconductor layer and the patterned light-absorbing layer after performing the heat treatment.

5. A method for manufacturing a semiconductor device comprising:

forming an island-like semiconductor layer over a glass substrate having an insulating surface;

forming an island-like light-absorbing layer that overlaps with a whole surface of the semiconductor layer through an insulating layer and whose end portions are arranged outside of the semiconductor layer;

performing a heat treatment for the semiconductor layer and the insulating layer by selectively heating the island-like light-absorbing layer through pulsed light irradiation; and patterning the island-like light-absorbing layer and the insulating layer to form a gate insulating layer between the semiconductor layer and the patterned light-absorbing layer after performing the heat treatment.

6. A method for manufacturing a semiconductor device comprising:

forming a first insulating layer over a glass substrate having an insulating surface;

forming an island-like semiconductor layer over the first insulating layer;

forming a second insulating layer covering a top face and a side face of the semiconductor layer;

forming an island-like light-absorbing layer over the second insulating layer, the light-absorbing layer that covers the top face and the side face of the semiconductor layer and whose end portions are arranged outside of the semiconductor layer;

performing a heat treatment for the semiconductor layer and the insulating layer by selectively heating the island-like light-absorbing layer through pulsed light irradiation; and forming a gate electrode overlapping with the semiconductor layer with a gate insulating film between the semiconductor layer and the gate electrode after performing the heat treatment by forming a metal layer over the island-like light-absorbing layer and then patterning the island-like light-absorbing layer and the metal layer and the second insulating layer.

7. A method for manufacturing a semiconductor device comprising:

forming an island-like divided semiconductor layer over a glass substrate;

forming an insulating layer over the island-like divided semiconductor layer;

forming an island-like light-absorbing layer that overlaps with a whole surface of the semiconductor layer through the insulating layer and whose end portions are arranged outside of the semiconductor layer;

performing a heat treatment for the semiconductor layer and the insulating layer by selectively heating the island-like light-absorbing layer through a plurality of times of pulsed light irradiation; and patterning the island-like light-absorbing layer and the insulating layer to form a gate insulating layer between the island-like divided semiconductor layer and the patterned light-absorbing layer after performing the heat treatment.

8. A method for manufacturing a semiconductor device comprising:

forming an island-like divided semiconductor layer over a glass substrate whose transmission factor of pulsed light emitted from a pulsed light source is 70 percent or more;

forming an island-like light-absorbing layer that overlaps with a whole surface of the semiconductor layer through an insulating layer, whose end portions are arranged outside of the semiconductor layer, and whose transmission factor of the pulsed light is 70 percent or less;

performing a heat treatment for the semiconductor layer and the insulating layer by selectively heating the island-like light-absorbing layer through a plurality of times of the pulsed light irradiation; and patterning the island-like light-absorbing layer and the insulating layer to form a gate insulating layer between the island-like divided semiconductor layer and the patterned light-absorbing layer after performing the heat treatment.

9. A method for manufacturing a semiconductor device according to any one of claims 1 to 8, wherein the light-absorbing layer comprises a metal nitride.

10. A method for manufacturing a semiconductor device according to any one of claims 1 to 8, wherein the pulsed light is coherent light.

11. A method for manufacturing a semiconductor device according to any one of claims 1 to 8, wherein the pulsed light is coherent light that has a pulse width of from 10 to 100 nanoseconds.

12. A method for manufacturing a semiconductor device according to any one of claims 1 to 8, wherein the pulsed light is non-coherent light that has a pulse width of from 1 to 100 microseconds.

13. A method for manufacturing a semiconductor device according to any one of claims 1 to 8, wherein a light source of the pulsed light is a pulsed laser oscillator.

14. A method for manufacturing a semiconductor device according to any one of claims 1 to 8, wherein a light source of the pulsed light is a xenon flash lamp.

15. A heat treatment method comprising:

forming an object to be heated over a glass substrate whose transmission factor of a pulsed light that is emitted from a pulsed light source is 70 percent or more;

forming an insulating layer over the object;

forming an island-like light-absorbing layer over the insulating layer such that a length of one side of the island-like light-absorbing layer is equal to or less than a thickness of the glass substrate and the island-like light-absorbing layer covers the object and end portions of the island-like light-absorbing layer are arranged outside of the object;

performing a heat treatment for the object to be heated by selectively heating a region where the island-like light-absorbing layer is formed, through the pulsed light irradiation; and patterning the island-like light-absorbing layer and the insulating layer after performing the heat treatment, wherein the island-like light-absorbing layer has a transmission factor of pulsed light at 70 percent or less; and wherein the island-like light-absorbing layer is capable of absorbing the pulsed light.

16. A heat treatment method according to claim 15, wherein the light-absorbing layer is a metal nitride.

17. A heat treatment method according to claim 15, wherein the pulsed light is coherent light.

18. A heat treatment method according to claim 15, wherein the pulsed light is coherent light that has a pulse width of from 10 to 100 nanoseconds.

19. A heat treatment method according to claim 15, wherein the pulsed light is non-coherent light that has a pulse width of from 1 to 100 microseconds.

20. A heat treatment method according to claim 15, wherein a light source of the pulsed light is a pulsed laser oscillator.

21. A heat treatment method according to claim 15, wherein a light source of the pulsed light is a xenon flash lamp.

22. A method for manufacturing a semiconductor device according to any one of claim 1 to 8 wherein said island-like light-absorbing layer is formed so as to completely cover the semiconductor layer.

23. A method for manufacturing a semiconductor device according to claim 1 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 100nm.

24. A method for manufacturing a semiconductor device according to claim 2 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 100nm.

25. A method for manufacturing a semiconductor device according to claim 3 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 100nm.

26. A method for manufacturing a semiconductor device according to claim 4 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 100nm.

27. A method for manufacturing a semiconductor device according to claim 5 wherein the light-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thicknesses of 10nm to 100m 28. A method for manufacturing a semiconductor device according to claim 6 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 10nm.

29. A method for manufacturing a semiconductor device according to claim 7 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 100nm.

30. A method for manufacturing a semiconductor device according to claim 8 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 100nm.

31. A heat treatment method according to claim 15 wherein the island-like light-absorbing layer comprises a material selected from the group consisting of molybdenum, tungsten, titanium, titanium nitride, tantalum nitride, tungsten nitride, tungsten silicide, molybdenum silicide, titanium silicide, tantalum silicide, chromium silicide, cobalt silicide, platinum silicide, and polycrystalline silicon doped with phosphorous or boron and wherein the island-like light-absorbing layer has a thickness of 10nm to 100nm.

* * * * *